US012588269B2

(12) United States Patent
Kim et al.

(10) Patent No.: US 12,588,269 B2
(45) Date of Patent: Mar. 24, 2026

(54) SEMICONDUCTOR DEVICES INCLUDING SEPARATION STRUCTURE

(71) Applicant: Samsung Electronics Co., Ltd., Suwon-si (KR)

(72) Inventors: Sungmin Kim, Incheon (KR); Daewon Ha, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 886 days.

(21) Appl. No.: 17/388,584

(22) Filed: Jul. 29, 2021

(65) Prior Publication Data

US 2022/0223711 A1 Jul. 14, 2022

(30) Foreign Application Priority Data

Jan. 8, 2021 (KR) ........................ 10-2021-0002272

(51) Int. Cl.
*H01L 29/49* (2006.01)
*H01L 21/02* (2006.01)
(Continued)

(52) U.S. Cl.
CPC ....... *H10D 64/671* (2025.01); *H01L 21/0259* (2013.01); *H10D 30/031* (2025.01);
(Continued)

(58) Field of Classification Search
None
See application file for complete search history.

(56) References Cited

U.S. PATENT DOCUMENTS 9,780,218 B1 10/2017 Liu et al.
9,935,199 B2 4/2018 Ching et al.
(Continued)

FOREIGN PATENT DOCUMENTS

KR 10-2018-0103502 A 9/2018
KR 10-2020-0037903 A 4/2020
(Continued)

OTHER PUBLICATIONS

Korean Office Action issued in related Korean Patent Application 10-2021-0002272, dated Aug. 17, 2025.
(Continued)

*Primary Examiner* — Yara B Green
*Assistant Examiner* — Fakeha Sehar
(74) *Attorney, Agent, or Firm* — Harness, Dickey & Pierce, P.L.C.

(57) ABSTRACT

A semiconductor device includes a plurality of active regions on a substrate. A gate electrode is on, and intersects, the active regions. A plurality of source/drain regions are on the active regions, such that the source/drain regions are adjacent to opposite sides of the gate electrode and the gate electrode is between the source/drain regions. A separation structure is between adjacent source/drain regions. The separation structure includes an insulating pattern and a spacer layer. The insulating pattern includes first and second side surfaces that are opposite side surfaces of the insulating pattern and are adjacent to separate, respective source/drain regions. The spacer layer is on the first and second side surfaces. An uppermost end of the insulating pattern is farther from a lower surface of the substrate than a first upper surface of the spacer layer that is adjacent to the first and second side surfaces.

14 Claims, 27 Drawing Sheets

(51) Int. Cl.

| | |
|---|---|
| *H01L 29/06* | (2006.01) |
| *H01L 29/423* | (2006.01) |
| *H01L 29/66* | (2006.01) |
| *H01L 29/786* | (2006.01) |
| *H10D 30/01* | (2025.01) |
| *H10D 30/67* | (2025.01) |
| *H10D 62/10* | (2025.01) |
| *H10D 64/01* | (2025.01) |
| *H10D 64/66* | (2025.01) |

(52) U.S. Cl.

CPC ..... *H10D 30/6713* (2025.01); *H10D 30/6735* (2025.01); *H10D 30/6739* (2025.01); *H10D 30/6757* (2025.01); *H10D 62/118* (2025.01); *H10D 64/017* (2025.01); *H10D 64/018* (2025.01)

(56) References Cited

U.S. PATENT DOCUMENTS

| | | | |
|---|---|---|---|
| 10,381,464 | B2 | 8/2019 | Xie |
| 10,770,461 | B2 | 9/2020 | Hashemi et al. |
| 2014/0001554 | A1 | 1/2014 | Adam et al. |
| 2014/0091360 | A1 | 4/2014 | Pillarisetty et al. |
| 2014/0213037 | A1 | 7/2014 | LiCausi et al. |
| 2014/0291726 | A1 | 10/2014 | Pillarisetty et al. |
| 2017/0162453 | A1 | 6/2017 | Pillarisetty et al. |
| 2018/0158930 | A1 | 6/2018 | Liao et al. |
| 2019/0214473 | A1 | 7/2019 | Xie et al. |
| 2019/0304984 | A1* | 10/2019 | Chang ............... H01L 29/66795 |
| 2020/0006559 | A1 | 1/2020 | Mehandru et al. |
| 2020/0006577 | A1 | 1/2020 | Ching et al. |
| 2020/0058560 | A1 | 2/2020 | Chen et al. |
| 2020/0091144 | A1 | 3/2020 | Guler et al. |
| 2020/0135578 | A1* | 4/2020 | Ching ................... H01L 21/743 |
| 2021/0226051 | A1* | 7/2021 | Hsu .................... H10D 84/0188 |
| 2021/0313448 | A1* | 10/2021 | Wang ............. H01L 21/823871 |
| 2022/0359766 | A1* | 11/2022 | Ferng ............... H01L 29/66636 |

FOREIGN PATENT DOCUMENTS

| | | | |
|---|---|---|---|
| KR | 10-2020-0050329 | A | 5/2020 |
| TW | 201626441 | A | 7/2016 |

OTHER PUBLICATIONS

Korean Notice of Allowance issued in corresponding Korean Application No. 10-2021-0002272, dated Dec. 22, 2025, and English translation thereof.

* cited by examiner

FIG. 5

SEMICONDUCTOR DEVICES INCLUDING SEPARATION STRUCTURE

CROSS-REFERENCE TO THE RELATED APPLICATION

This non-provisional patent application claims priority, under 35 U.S.C. § 119, from Korean Patent Application No. 10-2021-0002272, filed on Jan. 8, 2021, in the Korean Intellectual Property Office, the inventive concepts of which is incorporated herein by reference in its entirety.

BACKGROUND

1. Field

Some example embodiments of the inventive concepts relate to semiconductor devices including a separation structure between source/drain regions, and formation methods thereof.

2. Description of the Related Art

In accordance with high integration of a semiconductor device, electrically separating a plurality of elements becomes more difficult. For example, the spacing among a plurality of sources/drains is gradually reduced. Such a reduction in the spacing among the plurality of sources/drains may cause an increase in leakage current.

SUMMARY

Some example embodiments of the inventive concepts provide semiconductor devices having excellent electrical characteristics while being advantageous in terms of mass production efficiency, and formation methods thereof.

A semiconductor device according to some example embodiments of the inventive concepts includes a plurality of active regions on a substrate. A gate electrode intersects the plurality of active regions. A plurality of source/drain regions are on the plurality of active regions such that the plurality of source/drain regions are adjacent to opposite sides of the gate electrode and the gate electrode is between the plurality of source/drain regions. A separation structure is between adjacent source/drain regions of the plurality of source/drain regions. The separation structure includes an insulating pattern and a spacer layer. The insulating pattern includes first and second side surfaces that are opposite side surfaces of the insulating pattern and are adjacent to separate, respective source/drain regions of the adjacent source/drain regions. The spacer layer is disposed on the first and second side surfaces. An uppermost end of the insulating pattern is farther from a lower surface of the substrate than a first upper surface of the spacer layer that is adjacent to the first and second side surfaces.

A semiconductor device according to some example embodiments of the inventive concepts includes an element isolation layer defining a plurality of active regions on a substrate. A gate electrode intersects the plurality of active regions while extending on the element isolation layer. A plurality of source/drain regions are on the plurality of active regions, such that the plurality of source/drain regions are adjacent to opposite sides of the gate electrode and the gate electrode is between the plurality of source/drain regions. A separation structure is on the element isolation layer and between adjacent source/drain regions of the plurality of source/drain regions. The separation structure includes an insulating pattern and a spacer layer. The insulating pattern includes first and second side surfaces that are opposite side surfaces of the insulating pattern and are adjacent to separate, respective source/drain regions of the adjacent source/drain regions. The spacer layer is disposed on the first side surface, the second side surface and the third side surface. An uppermost end of the insulating pattern is farther from a lower surface of the substrate than a first upper surface of the spacer layer that is adjacent to the first and second side surfaces. The uppermost end of the insulating pattern is nearer to the lower surface of the substrate than a second upper surface of the spacer layer that is adjacent to the third side surface.

A semiconductor device according to some example embodiments of the inventive concepts includes an element isolation layer defining a plurality of active regions on a substrate. A plurality of gate electrodes intersect the plurality of active regions while extending on the element isolation layer. A plurality of source/drain regions are on the plurality of active regions adjacent to opposite sides of each of the gate electrodes. A separation structure is on the element isolation layer between adjacent source/drain regions of the plurality of source/drain regions and between adjacent gate electrodes of the plurality of gate electrodes. The separation structure includes an insulating pattern and a spacer layer. The insulating pattern includes first and second side surfaces that are opposite side surfaces of the insulating pattern and are adjacent to separate, respective source/drain regions of the adjacent source/drain regions, and a third side surface adjacent to the gate electrode. The spacer layer is disposed on the first side surface, the second side surface, the third side surface and the fourth side surface. An uppermost end of the insulating pattern is farther from a lower surface of the substrate than a first upper surface of the spacer layer that is adjacent to the first and second side surfaces. The uppermost end of the insulating pattern is nearer to the lower surface of the substrate than a second upper surface of the spacer layer that is adjacent to the third and fourth side surfaces.

BRIEF DESCRIPTION OF THE DRAWINGS

FIG. 5 is a layout of semiconductor devices according to some example embodiments of the inventive concepts.

DETAILED DESCRIPTION

Figure 2:
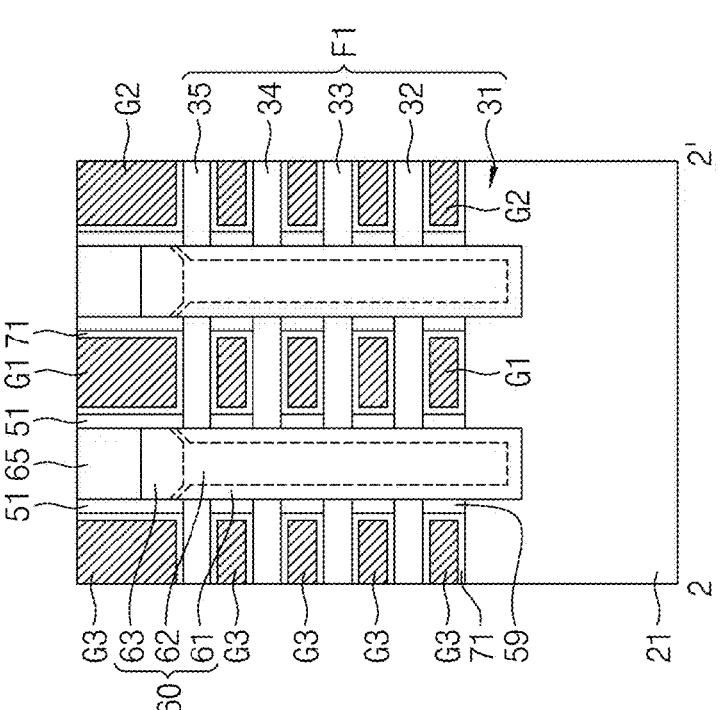
FIGS. 1, 2, 3, and 4 are cross-sectional views explaining semiconductor devices according to some example embodiments of the inventive concepts.
Figure 1:
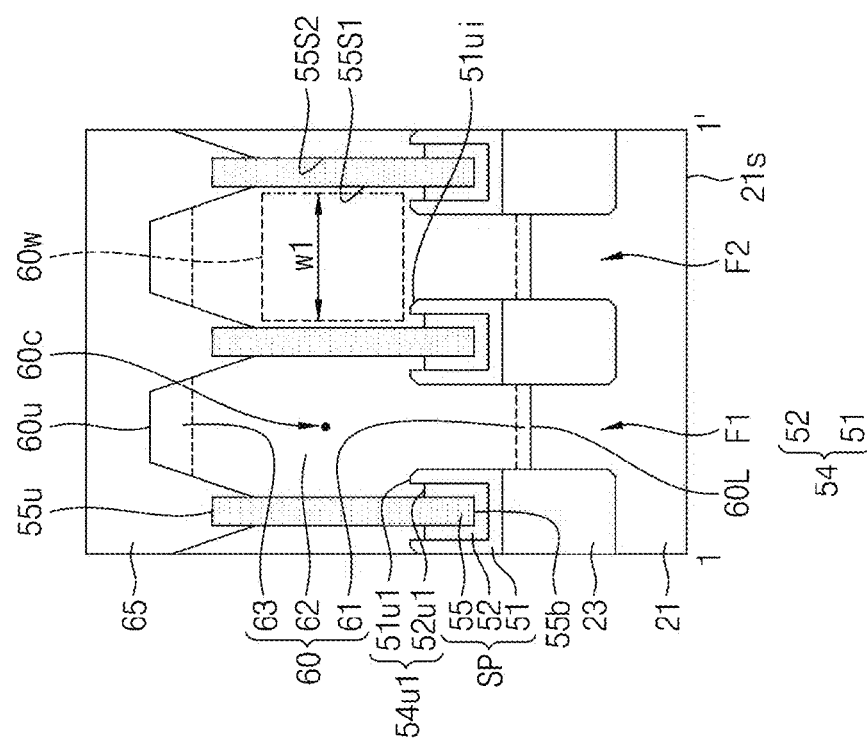
Figures 3, 4:
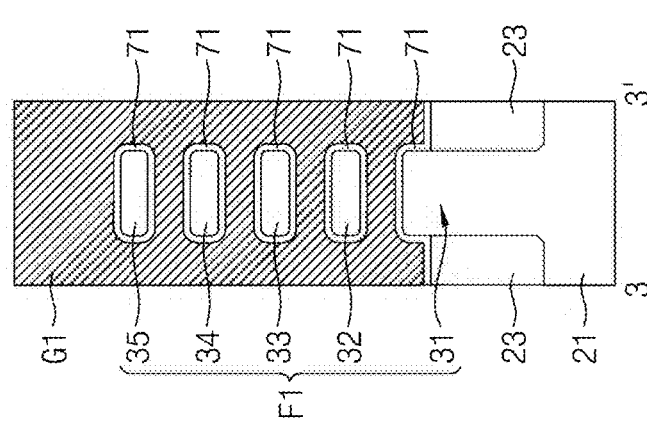
Figure 5:
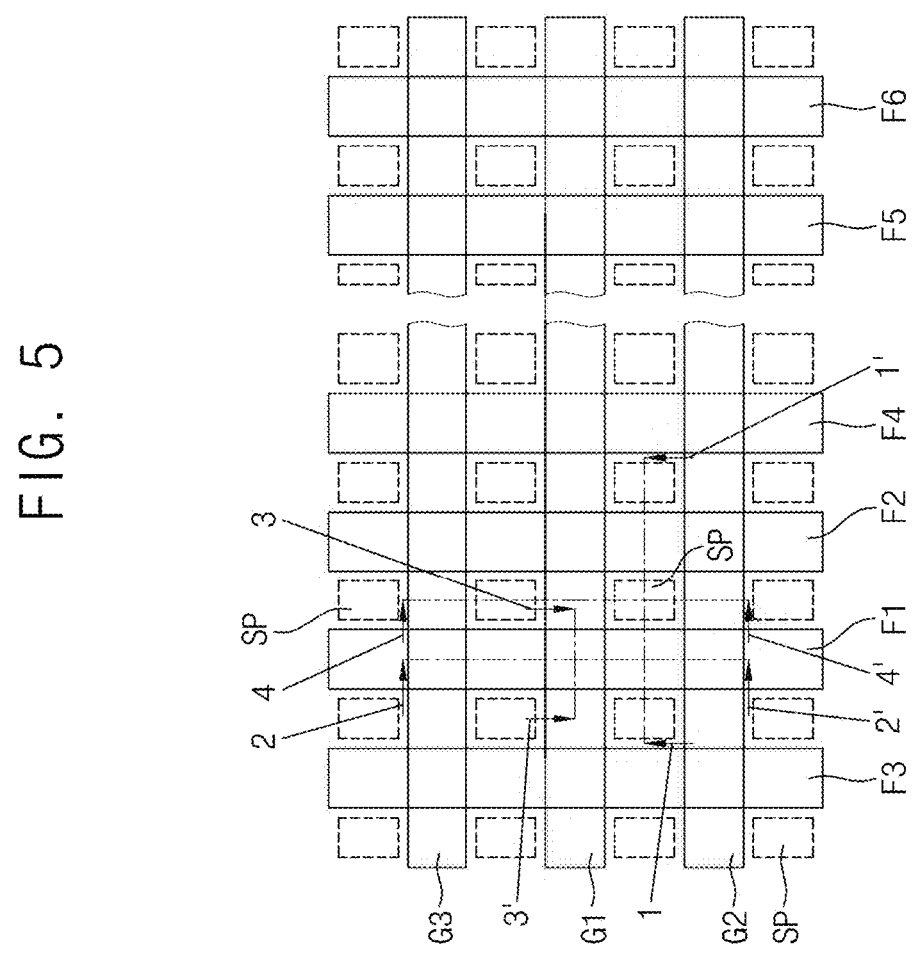

FIGS. 1, 2, 3, and 4 are cross-sectional views explaining semiconductor devices according to some example embodiments of the inventive concepts. FIG. 5 is a layout of semiconductor devices according to some example embodiments of the inventive concepts. FIG. 1 may be a cross-sectional view taken along line 1-1' in FIG. 5. FIG. 2 may be a cross-sectional view taken along line 2-2' in FIG. 5. FIG. 3 may be a cross-sectional view taken along line 3-3' in FIG. 5. FIG. 4 may be a cross-sectional view taken along line 4-4' in FIG. 5. In some example embodiments, semiconductor devices according to some example embodiments of the inventive concepts may include a multi-bridge channel transistor such as MBCFET, a fin field effect transistor (FinFET), a nanowire transistor, a vertical transistor, a recess channel transistor, a 3-D transistor, a planar transistor, or a combination thereof.

Referring to FIG. 1, a semiconductor device according to some example embodiments of the inventive concepts may include a substrate 21, an element isolation layer 23, a plurality of active regions F1 and F2, a plurality of separation structures SP, a plurality of source/drain regions 60, and an interlayer insulating layer 65. The active regions F1 and F2 may be referred to as being "on" the substrate 21. The active regions may be referred to as being portions of the substrate 21 that are at least partially defined by an element isolation layer 23 and may be referred to as being at least partially "in" the substrate 21. Each of the plurality of separation structures SP may include a first spacer layer 51, a second spacer layer 52, and an insulating pattern 55. In some example embodiments, the first spacer layer 51 and the second spacer layer 52 may be collectively referred to as a spacer layer 54 on (e.g., in direct contact with) the first and second side surfaces 55S1 and 55S2. In some example embodiments, either of the first spacer layer 51 or the second spacer layer 52 may be referred to as a spacer layer on (e.g., indirectly on or in direct contact with) the first and second side surfaces 55S1 and 55S2. In some example embodiments, one of the first spacer layer 51 or the second spacer layer 52 may be omitted, and the remainder of the first spacer layer 51 or the second spacer layer 52 may be referred to as a spacer layer 54 on (e.g., indirectly on or in direct contact with) the first and second side surfaces 55S1 and 55S2. The insulating pattern 55 may include a first side surface 55S1 and a second side surface 55S2 which face each other (e.g., are opposite side surfaces of the insulating pattern 55 as shown in at least FIG. 1). The spacer layer (e.g., 51, 52, and/or 54) may be referred to as being adjacent to the first and second side surfaces 55S1 and 55S2. Each of the plurality of source/drain regions 60 may include a first layer 61, a second layer 62, and a third layer 63.

Referring to FIG. 2, semiconductor devices according to some example embodiments of the inventive concepts may include a substrate 21, a first active region F1, a first spacer layer 51, a plurality of source/drain regions 60, a plurality of insulating plugs 59, an interlayer insulating layer 65, a gate dielectric layer 71, and a plurality of gate electrodes G1 to G3. The first active region F1 may include a plurality of active patterns 31 to 35 contacting the source/drain regions 60. For example, the plurality of active patterns 31 to 35 may include a first active pattern 31, a second active pattern 32, a third active pattern 33, a fourth active pattern 34, and a fifth active pattern 35. Each of the plurality of source/drain regions 60 may include a first layer 61, a second layer 62, and a third layer 63. The plurality of gate electrodes G1 to G3 may include a first gate electrode G1, a second gate electrode G2, and a third gate electrode G3.

Referring to FIG. 3, semiconductor devices according to some example embodiments of the inventive concepts may include a substrate 21, an element isolation layer 23, a first active region F1, a gate dielectric layer 71, and a first gate electrode G1. The first active region F1 may include a plurality of active patterns 31 to 35. For example, the plurality of active patterns 31 to 35 may include a first active pattern 31, a second active pattern 32, a third active pattern 33, a fourth active pattern 34, and a fifth active pattern 35.

Referring to FIG. 4, semiconductor devices according to some example embodiments of the inventive concepts may include a substrate 21, an element isolation layer 23, a first spacer layer 51, a second spacer layer 52, a plurality of insulating patterns 55, an interlayer insulating layer 65, a gate dielectric layer 71, and a plurality of gate electrodes G1 to G3. Each of the plurality of insulating patterns 55 may include a third side surface 55S3 and a fourth side surface 55S4 facing each other. The plurality of gate electrodes G1 to G3 may include a first gate electrode G1, a second gate electrode G2, and a third gate electrode G3.

Referring to FIG. 5, semiconductor devices according to some example embodiments of the inventive concepts may include a plurality of active regions F1 to F6, a plurality of gate electrodes G1 to G3, and a plurality of separation structures SP. The plurality of active regions F1 to F6 may include a first active region F1, a second active region F2, a third active region F3, a fourth active region F4, a fifth active region F5, and a sixth active region F6. The plurality of gate electrodes G1 to G3 may include a first gate electrode G1, a second gate electrode G2, and a third gate electrode G3.

Again referring to FIGS. 1 to 5, the element isolation layer 23 may be provided on the substrate 21, to define the plurality of active regions F1 to F6 on the substrate 21. The plurality of active regions F1 to F6 may be parallel. As shown in FIGS. 1 to 5, the plurality of gate electrodes G1 to G3 may be provided to extend on the element isolation layer 23 while intersecting the plurality of active regions F1 to F6. As shown in FIGS. 1 to 5, the plurality of gate electrodes G1 to G3 may be parallel (e.g., extend in parallel to each other). As shown in FIGS. 1 to 5, the plurality of gate electrodes G1 to G3 may each intersect the plurality of active regions F1 to F6. As shown in FIGS. 1 to 5, each of the plurality of gate electrodes G1 to G3 may perpendicularly intersect the plurality of active regions F1 to F6.

The plurality of source/drain regions 60 may be provided to be disposed on the plurality of active regions F1 to F6 adjacent to opposite sides of each of the plurality of gate electrodes G1 to G3. As shown in FIGS. 1-5, the plurality of source/drain regions 60 may be adjacent to opposite sides of the gate electrodes G1 to G3, such that each gate electrode G1, G2, G3 is between (e.g., horizontally between) adjacent source/drain regions 60 of the plurality of source/drain region 60. For example, as shown in FIGS. 1 to 5, two adjacent source/drain regions 60 may be adjacent to opposite sides of the first gate electrode G1 such that the first gate electrode G1 is between the two adjacent source/drain regions 60. Each of the plurality of active patterns 31 to 35 may contact the plurality of source/drain regions 60. The gate electrodes G1 to G3 may cover upper and side surfaces of the plurality of active patterns 31 to 35. In some example embodiments, the second active pattern 32, the third active pattern 33, the fourth active pattern 34 and the fifth active pattern 35 may be sequentially vertically aligned on the first active pattern 31. The plurality of gate electrodes G1 to G3 may surround upper, lower and side surfaces of each of the second active pattern 32, the third active pattern 33, the fourth active pattern 34 and the fifth active pattern 35, and may cover upper and side surfaces of the first active pattern 31.

The plurality of separation structures SP may be provided to be disposed on the element isolation layer 23 disposed among the plurality of source/drain regions 60 and the plurality of gate electrodes G1 to G3. For example, as shown in FIGS. 1 to 5, each separation structure SP may be between adjacent source/drain regions 60 (e.g., between in a first horizontal direction) and/or between adjacent gate electrodes G1 to G3 (e.g., between in a second horizontal direction that intersects and/or is perpendicular to the first horizontal direction( ). Each of the plurality of separation structures SP may include the first spacer layer 51, the second spacer layer 52, and the insulating pattern 55. The insulating pattern 55 may include the first side surface 55S1 and the second side surface 55S2 which face each other (e.g., are first opposite side surfaces of the insulating pattern 55). Each of the first side surface 55S1 and the second side surface 55S2 may be adjacent to a corresponding one of the plurality of source/drain regions 60. Restated, and as shown in at least FIG. 1, the first side surface 55S1 and the second side surface 55S2 of an insulating pattern 55 of a given separation structure SP, which may be adjacently between two adjacent source/drain regions 60, may be adjacent to (e.g., directly contacting and/or proximate to) separate, respective source/drain regions 60 of the two adjacent source/drain regions 60. The insulating pattern 55 may include the third side surface 55S3 and the fourth side surface 55S4. Each of the third side surface 55S3 and the fourth side surface 55S4 may be adjacent to a corresponding one of the plurality of gate electrodes G1 to G3. The third side surface 55S3 and the fourth side surface 55S4 may face each other and/or may be second opposite side surfaces of the insulating pattern 55 that are adjacent to separate, respective gate electrodes of the adjacent gate electrodes of the gate electrodes G1 to G3.

The second spacer layer 52 may be between the first spacer layer 51 and the insulating pattern 55. The second spacer layer 52 may partially surround the first to fourth side surfaces 55S1, 55S2, 55S3 and 55S4 of the insulating pattern 55 and a bottom (e.g., lower surface 55b) of the insulating pattern 55. Accordingly, it will be understood that the spacer layer 54 may surround (in direct contact with or isolated from direct contact with, a direction perpendicular to the lower surface 21s (e.g., a vertical direction) and/or a direction parallel to the lower surface 21s (e.g., a horizontal direction)) the lower surface 55b of the insulating pattern 55. It will be understood that the spacer layer 54 (e.g., 51 and/or 52) may be on the first to fourth side surfaces 55S1 to 55S4. The spacer layer 54 (e.g., the first and/or second spacer layers 51 and/or 52) may be between the insulating pattern 55 and at least one gate electrode. The first spacer layer 51 may be disposed outside the second spacer layer 52. The first spacer layer 51 may extend between the element isolation layer 23 and the insulating pattern 55. The second spacer layer 52 may be disposed between the first spacer layer 51 and the insulating pattern 55. Accordingly, it will be understood that the spacer layer 54 may extend between the element isolation layer 23 and the insulating pattern 55.

An uppermost end 55u of the insulating pattern 55 may protrude to a higher level (e.g., may be further from the lower surface 21s in the direction perpendicular to the lower surface 21s) than a center 60c of each of the plurality of source/drain regions 60, for example as shown in FIG. 1. The center 60c of each source/drain region 60 may refer to a point or location that is equidistant from an uppermost end 60u and a lowermost end 60L of the source/drain region. As shown in at least FIG. 1, the uppermost end 55u of the insulating pattern 55 may protrude to a higher level than a portion 60w of the source/drain regions 60 having a maximum horizontal width w1 from among portions of each of the plurality of source/drain regions 60 (e.g., the portion 60w of each source/drain region 60 having a maximum horizontal width w1 of the source/drain region 60 in the direction that is parallel to the lower surface 21s. The plurality of source/drain regions 60 may contact (e.g., directly contact) the first and second side surfaces 55S1 and 55S2. Restated, where a separation structure SP is between adjacent source/ drain regions 60, the adjacent source/drain regions may directly contact separate, respective surfaces of the first and second side surfaces 55S1 and 55S2. Uppermost ends 60u of the plurality of source/drain regions 60 may protrude to a higher level than the uppermost end 55u of the insulating pattern 55.

As described herein, a "level" of a surface, end, structure, or the like may refer to a distance from the lower surface 21s of the substrate 21 in a direction that is perpendicular to the lower surface 21s of the substrate 21. Therefore, when a first element is described herein to be at a higher level than a second element, the first element may be further from the lower surface 21s than the second element in the direction that is perpendicular to the lower surface 21s. Furthermore, when a first element is described herein to be at a lower level than a second element, the first element may be closer to the lower surface 21s than the second element in the direction that is perpendicular to the lower surface 21s. Furthermore, when a first element is described herein to be at a same level as a second element, the first element may be equally distant from/close to the lower surface 21s as the second element in the direction that is perpendicular to the lower surface 21s.

The uppermost end 55u of the insulating pattern 55 may be farther from a lower surface 21s of the substrate 21 (e.g., may be at a higher level) than upper surfaces 51u1 and 52u1 of the first spacer layer 51 and the second spacer layer 52 adjacent to the first and second side surfaces 55S1 and 55S2. Restated, the uppermost end 55u of the insulating pattern 55 may be farther from the lower surface 21s of the substrate 21, in the direction that is perpendicular to the lower surface 21s, than a first upper surface 54u1 of the spacer layer 54 that is adjacent to the first and second side surfaces, where the first upper surface 54u1 may include either or both of the upper surfaces 51u1 and/or 52u1. The distance, in the direction perpendicular to the lower surface 21s, between the upper surfaces 51u1 and/or 52u1 of the first spacer layer 51 and the second spacer layer 52 adjacent to the first and second side surfaces 55S1 and 55S2 and the uppermost end 55u of the insulating pattern 55 (e.g., the distance between the first upper surface 54u1 and the uppermost end 55u) may be about 10 nm to about 50 nm. In some example embodiments, the distance between the upper surfaces of the first spacer layer 51 and the second spacer layer 52 adjacent to the first and second side surfaces 55S1 and 55S2 and the uppermost end 55u of the insulating pattern 55 may be about 20 nm or more.

The first spacer layer 51 adjacent to the first and second side surfaces 55S1 and 55S2 may include an inclined upper surface 51ui that is inclined in a direction that is inclined to the lower surface 21s (where said direction may be non-perpendicular and non-parallel to the lower surface 21s). It will thus be understood that the spacer layer 54 that is adjacent to the first and second side surfaces 55S1 and 55S2 may include the inclined upper surface 51ui. The inclined upper surface 51ui may have an inclination descending as the inclined upper surface becomes farther from the insulating pattern 55. The inclined upper surface 51ui may have an inclination that descends with distance from the insulating pattern 55 such that the level, in the direction perpendicular to the lower surface 21s, of a given portion of the inclined upper surface 51ui decreases in proportion to distance of the given portion of the inclined upper surface 51ui from the insulating pattern 55 in a direction that is parallel to the lower surface 21s. As shown in at least FIG. 1, the upper surface 52u1 of the second spacer layer 52 adjacent to the first and second side surfaces 55S1 and 55S2 may be nearer (e.g., closer) to the lower surface 21s of the substrate 21, in the direction that is perpendicular to the lower surface 21*s*, than the upper surface 51*u*1 of the first spacer layer 51 adjacent to the first and second side surfaces 55S1 and 55S2. The plurality of source/drain regions 60 may contact a side surface of the first spacer layer 51 and the upper surface 51*u*1 of the first spacer layer 51 while contacting the upper surface 52*u*1 of the second spacer layer 52. As shown in at least FIG. 1, the source/drain regions 60 may contact (e.g., directly contact) the upper surfaces 51*u*1 and 52*u*1 of the first spacer layer 51 and the second spacer layer 52.

The first spacer layer 51 and the second spacer layer 52 may extend between the insulating pattern 55 and the plurality of gate electrodes G1 to G3. As shown in FIG. 4, the first spacer layer 51 and the second spacer layer 52 may have respective second upper surfaces 51*u*2 and 52*u*2 that are adjacent to the third and fourth side surfaces 55S3 and 55S4. The second upper surfaces 51*u*2 and 52*u*2 may either, or collectively, be referred to as a second upper surface 54*u*2 of the spacer layer 54. The uppermost end 55*u* of the insulating pattern 55 may be nearer to the lower surface 21*s* of the substrate 21 than an upper surface of the first spacer layer 51 adjacent to the third and fourth side surfaces 55S3 and 55S4. Restated, and as shown in at least FIG. 4, the uppermost end 55*u* of the insulating pattern 55 may be nearer to the lower surface 21*s* of the substrate 21 than a second upper surface 51*u*2 of the first spacer layer 51 (and thus a second upper surface 54*u*2 of the spacer layer 54) adjacent to the third and fourth side surfaces 55S3 and 55S4. An uppermost end of the first spacer layer 51 may be substantially coplanar with upper surfaces of the plurality of gate electrodes G1 to G3. An upper surface of the second spacer layer 52 adjacent to the third and fourth side surfaces 55S3 and 55S4 may be nearer to the lower surface 21*s* of the substrate 21 than the uppermost end 55*u* of the insulating pattern 55.

The first spacer layer 51, the second spacer layer 52 and the insulating pattern 55 may include different materials, respectively. For example, each of the first spacer layer 51, the second spacer layer 52 and the insulating pattern 55 may each include a material that is not included in any other of the first spacer layer 51, the second spacer layer 52 and the insulating pattern 55 In some example embodiments, the first spacer layer 51 may include (e.g., partially or completely comprise) silicon oxycarbonitride (SiOCN), the second spacer layer 52 may include (e.g., partially or completely comprise) silicon oxide, and the insulating pattern 55 may include (e.g., partially or completely comprise) silicon nitride. In some example embodiments, the first spacer layer 51 may include (e.g., partially or completely comprise) silicon nitride, the second spacer layer 52 may include (e.g., partially or completely comprise) silicon oxide, and the insulating pattern 55 may include (e.g., partially or completely comprise) aluminum oxide such as $Al_2O_3$. In some example embodiments, the first spacer layer 51 may include (e.g., partially or completely comprise) silicon nitride, the second spacer layer 52 may include (e.g., partially or completely comprise) silicon oxide, and the insulating pattern 55 may include (e.g., partially or completely comprise) silicon oxycarbonitride (SiOCN). In some example embodiments, the insulating pattern 55 may include silicon nitride and the spacer layer 54 may include silicon oxycarbonitride (SiOCN).

Figure 7:
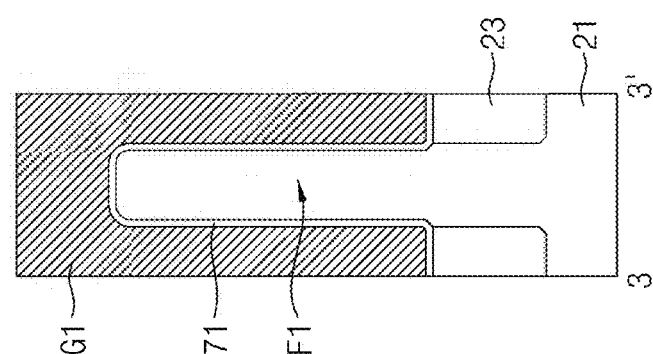
FIGS. 6, 7, 8, 9, 10, and 11 are cross-sectional views explaining semiconductor devices according to some example embodiments of the inventive concepts.
Figure 6:
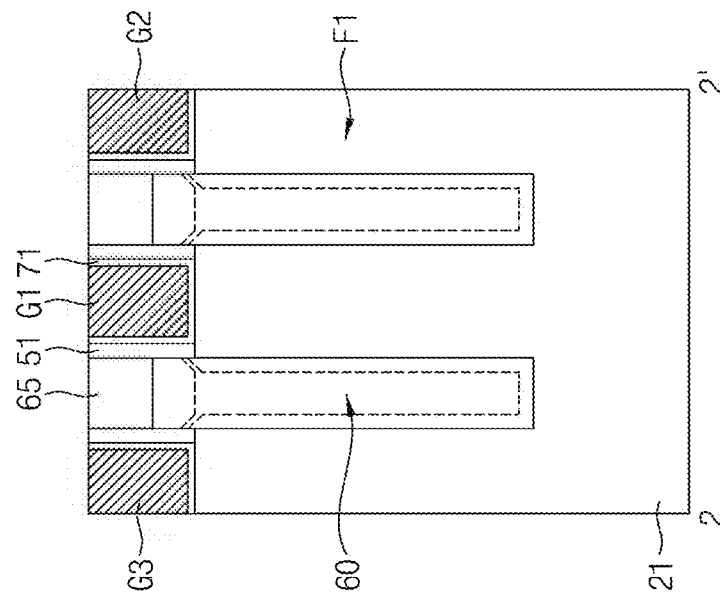

FIGS. 6 and 7 are cross-sectional views explaining semiconductor devices according to some example embodiments of the inventive concepts. FIG. 6 may be a cross-sectional view taken along line 2-2' in FIG. 5. FIG. 7 may be a cross-sectional view taken along line 3-3' in FIG. 5.

Referring to FIGS. 1, 4, 5, 6 and 7, each of active regions F1 to F6 may have a vertical height greater than a horizontal width thereof. Each of the plurality of active regions F1 to F6 may include a fin shape. An upper surface of an element isolation layer 23 may be recessed to a lower level than upper ends of the plurality of active regions F1 to F6. Each of the plurality of gate electrodes G1 to G3 may extend on the element isolation layer 23 while covering upper and side surfaces of a corresponding one of the plurality of active regions F1 to F6.

Figure 9:
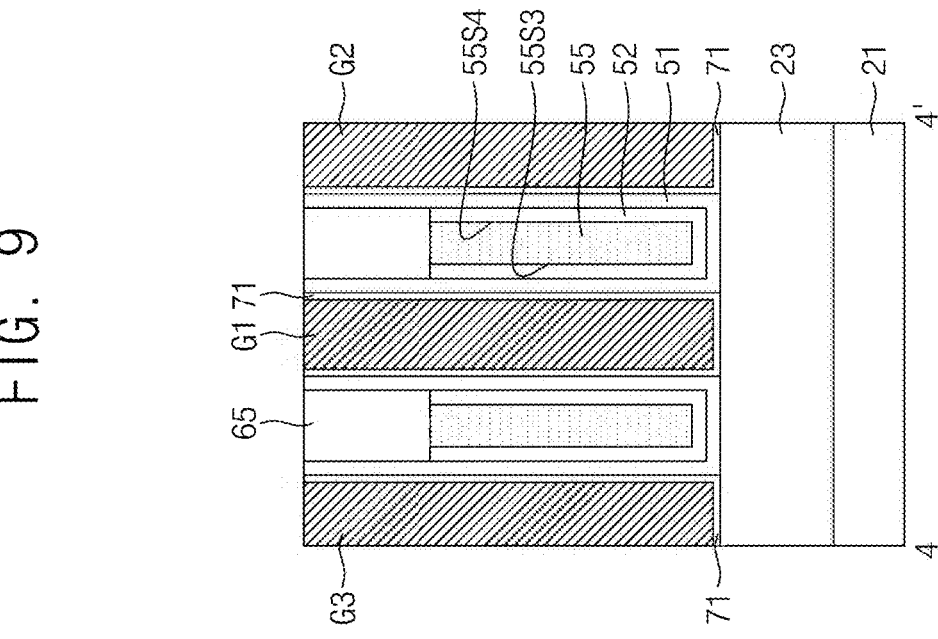
Figure 8:
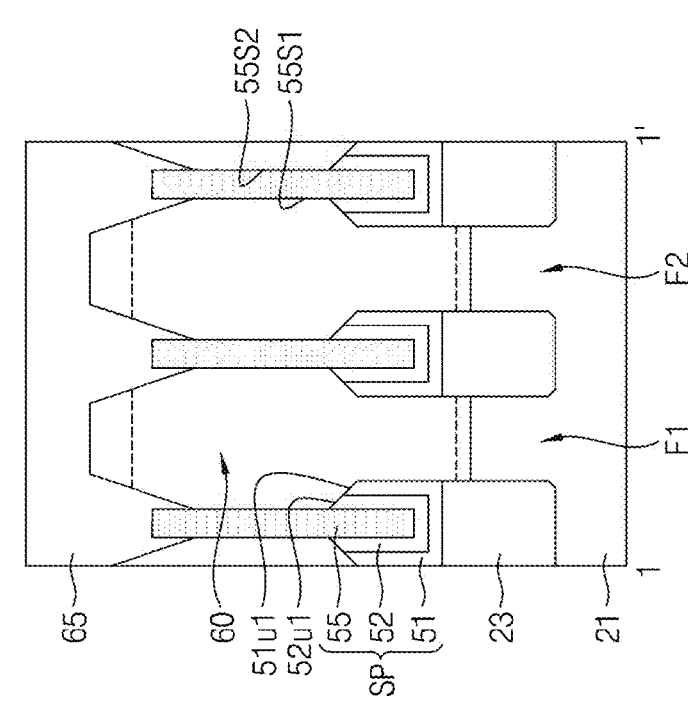

FIGS. 8 and 9 are cross-sectional views explaining semiconductor devices according to some example embodiments of the inventive concepts. FIG. 8 may be a cross-sectional view taken along line 1-1' in FIG. 5. FIG. 9 may be a cross-sectional view taken along line 4-4' in FIG. 5.

Referring to FIGS. 2, 3, 5, 8 and 9, an upper surface 52*u*1 of a second spacer layer 52 adjacent to first and second side surfaces 55S1 and 55S2 may be farther from a lower surface 21*s* of a substrate 21, in the direction that is perpendicular to the lower surface 21*s*, than an upper surface 51*u*1 of a first spacer layer 51 adjacent to the first and second side surfaces 55S1 and 55S2. The first spacer layer 51 and the second spacer layer 52 adjacent to the first and second side surfaces 55S1 and 55S2 may include inclined upper surfaces, respectively. The inclined upper surfaces may have an inclination descending as the inclined upper surfaces become farther from an insulating pattern 55. An upper surface of the second spacer layer 52 adjacent to third and fourth side surfaces 55S3 and 55S4 may be substantially coplanar with an upper surface of the insulating pattern 55.

Figure 11:
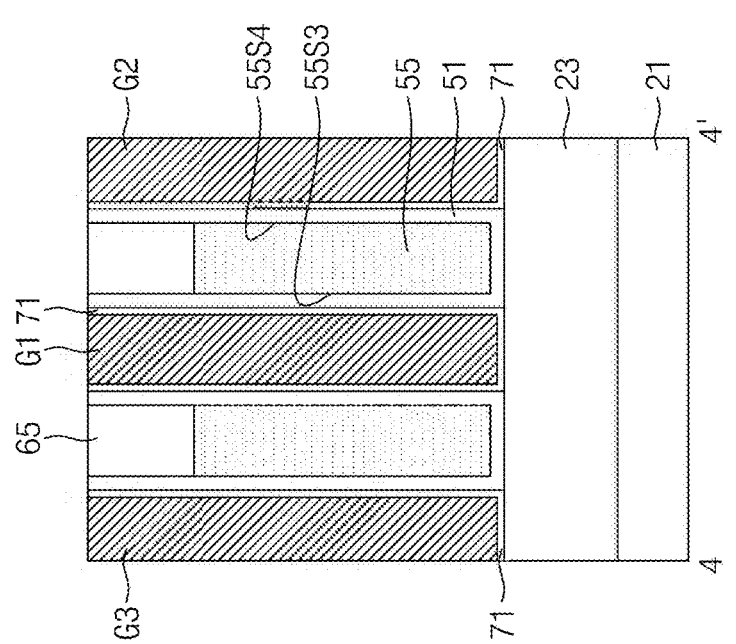
Figure 10:
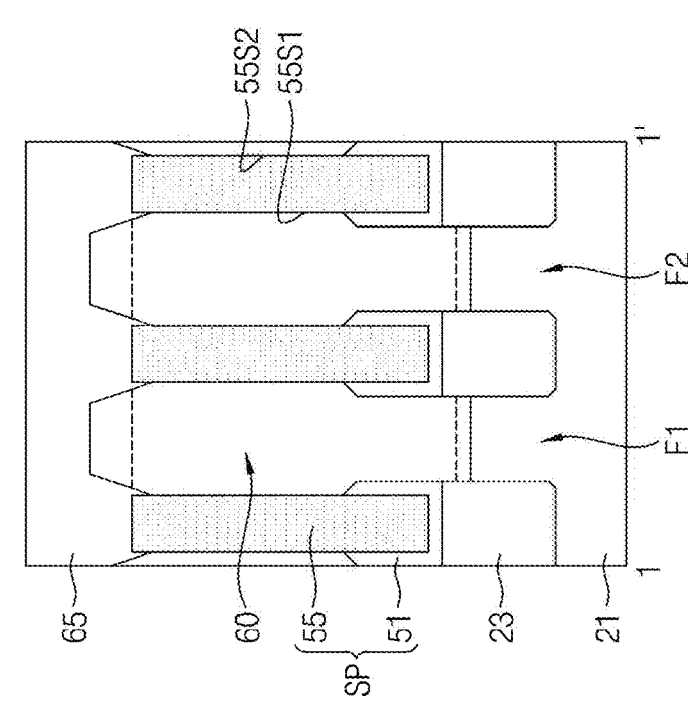

FIGS. 10 and 11 are cross-sectional views explaining semiconductor devices according to some example embodiments of the inventive concepts. FIG. 10 may be a cross-sectional view taken along line 1-1' in FIG. 5. FIG. 11 may be a cross-sectional view taken along line 4-4' in FIG. 5.

Referring to FIGS. 2, 3, 5, 10 and 11, each of a plurality of separation structures SP may include a first spacer layer 51 and an insulating pattern 55. The first spacer layer 51 may partially cover lower and side surfaces of the insulating pattern 55. The first spacer layer 51, which is adjacent to first and second side surfaces 55S1 and 55S2, may include an inclined upper surface. The inclined upper surface may have an inclination descending as the inclined upper surface becomes farther from the insulating pattern 55.

FIGS. 12, 13, 14, 15, 16, 17, 18, 19, 20, 21, 22, 23, and 24 are cross-sectional views taken along lines 1-1', 2-2', 3-3' and 4-4' in FIG. 5, to explain formation methods (e.g., methods of manufacture) of semiconductor devices according to some example embodiments of the inventive concepts.

Figure 12:
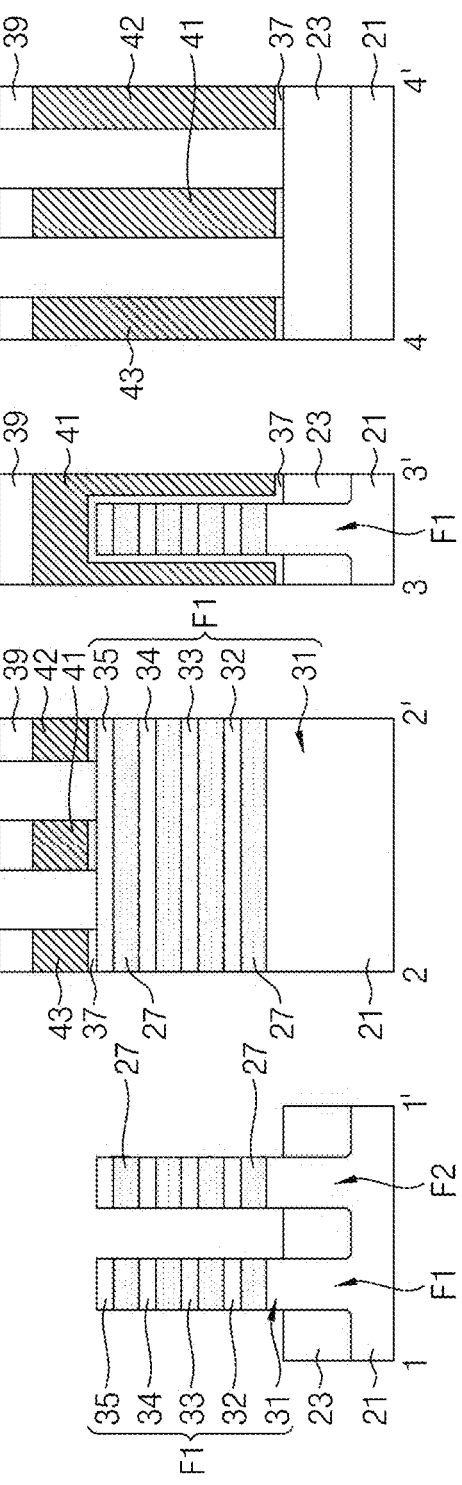
FIGS. 12, 13, 14, 15, 16, 17, 18, 19, 20, 21, 22, 23, 24, 25, 26, 27, 28, 29, 30, 31, and 32 are cross-sectional views explaining formation methods of semiconductor devices according to some example embodiments of the inventive concepts.

Referring to FIGS. 5 and 12, an element isolation layer 23 may be formed on a substrate 21, to define a plurality of active regions F1 to F6. The plurality of active regions F1 to F6 may be spaced apart from one another. The plurality of active regions F1 to F6 may be parallel. Each of the active regions F1 to F6 may include a plurality of active patterns 31 to 35. For example, the plurality of active patterns 31 to 35 may include a first active pattern 31, a second active pattern 32, a third active pattern 33, a fourth active pattern 34, and a fifth active pattern 35. A plurality of sacrificial patterns 27 may be formed among the plurality of active patterns 31 to 35. A plurality of temporary gate electrodes 41, 42, and 43 may be formed to intersect the plurality of active regions F1 to F6. A buffer layer 37 may be formed between the plurality of temporary gate electrodes 41, 42, and 43 and the plurality of active regions F1 to F6. A hard mask pattern 39 may be formed on the plurality of temporary gate electrodes 41, 42, and 43.

The substrate 21 may include a semiconductor substrate such as a silicon wafer or a silicon-on-insulator (SOI) wafer. The element isolation layer 23 may include an insulating layer formed using a shallow trench isolation (STI) method. The element isolation layer 23 may include silicon oxide, silicon nitride, silicon oxynitride, silicon boron nitride (SiBN), silicon carbon nitride (SiCN), low-k dielectrics, high-k dielectrics, or a combination thereof.

The first active pattern 31, the second active pattern 32, the third active pattern 33, the fourth active pattern 34, and the fifth active pattern 35 may be sequentially stacked. The plurality of sacrificial patterns 27 may be interposed among the first active pattern 31, the second active pattern 32, the third active pattern 33, the fourth active pattern 34, and the fifth active pattern 35. In some example embodiments, the second active pattern 32, the third active pattern 33, the fourth active pattern 34, and the fifth active pattern 35 may include monocrystalline silicon formed using an epitaxial growth method. The plurality of sacrificial patterns 27 may include SiGe formed using an epitaxial growth method.

An upper surface of the element isolation layer 23 may be recessed to a lower level than upper ends of the plurality of active regions F1 to F6. In some example embodiments, the upper surface of the element isolation layer 23 may be formed at a lower level than an uppermost end of the first active pattern 31. The first active pattern 31 may be defined in the substrate 21 by the element isolation layer 23. In some example embodiments, the first active pattern 31 may include monocrystalline silicon.

The plurality of active patterns 31 to 35 may include P-type or N-type impurities. In some example embodiments, the first active pattern 31, the second active pattern 32, the third active pattern 33, the fourth active pattern 34, and the fifth active pattern 35 may include monocrystalline silicon including N-type impurities.

The buffer layer 37 may include silicon oxide. The plurality of temporary gate electrodes 41, 42, and 43 may be parallel. Each of the plurality of temporary gate electrodes 41, 42, and 43 may cover upper and side surfaces of the plurality of active regions F1 to F6. Each of the plurality of temporary gate electrodes 41, 42, and 43 may extend on the element isolation layer 23. The plurality of temporary gate electrodes 41, 42, and 43 may include polysilicon. The hard mask pattern 39 may include silicon oxide, silicon nitride, silicon oxynitride, or a combination thereof.

Figure 13:
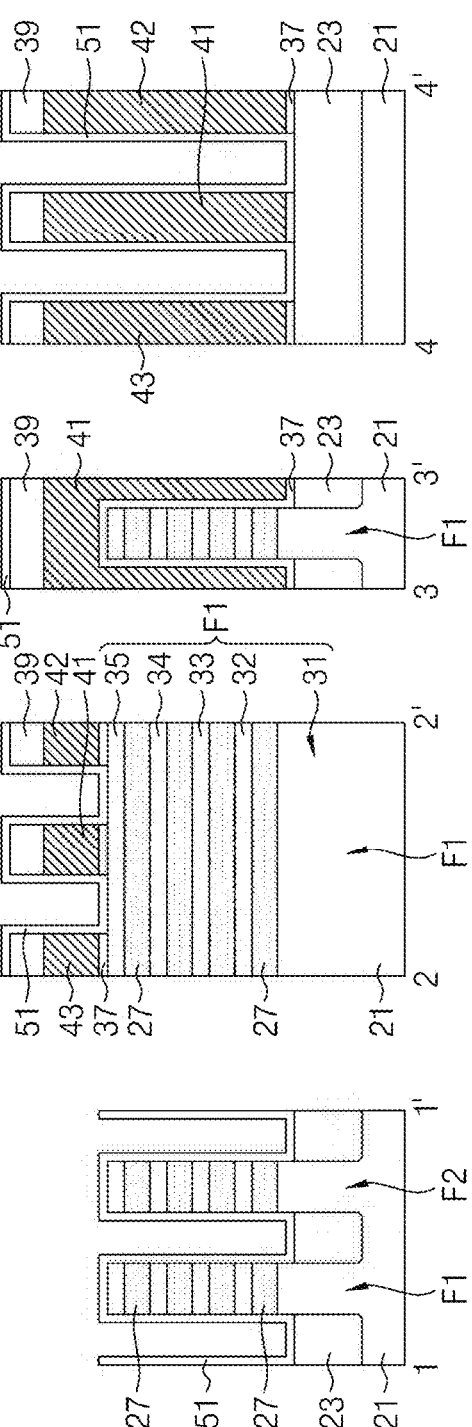

Referring to FIGS. 5 and 13, a first spacer layer 51 may be formed to conformally cover the element isolation layer 23, the plurality of active regions F1 to F6, the plurality of temporary gate electrodes 41, 42, and 43 and the hard mask pattern 39. The first spacer layer 51 may include silicon oxycarbonitride (SiOCN), silicon oxide, silicon nitride, silicon oxynitride, silicon boron nitride (SiBN), silicon carbon nitride (SiCN), low-k dielectrics, high-k dielectrics, or a combination thereof.

In some example embodiments, the first spacer layer 51 may include a material having etch selectivity with respect to the plurality of temporary gate electrodes 41, 42, and 43 and the buffer layer 37. The first spacer layer 51 may include a material different from those of the plurality of temporary gate electrodes 41, 42, and 43 and the buffer layer 37. The first spacer layer 51 may include silicon oxycarbonitride (SiOCN) or silicon nitride. The first spacer layer 51 may extend on the element isolation layer 23 while covering side surfaces of the plurality of active regions F1 to F6, the buffer layer 37 and the plurality of temporary gate electrodes 41, 42, and 43.

Figure 14:
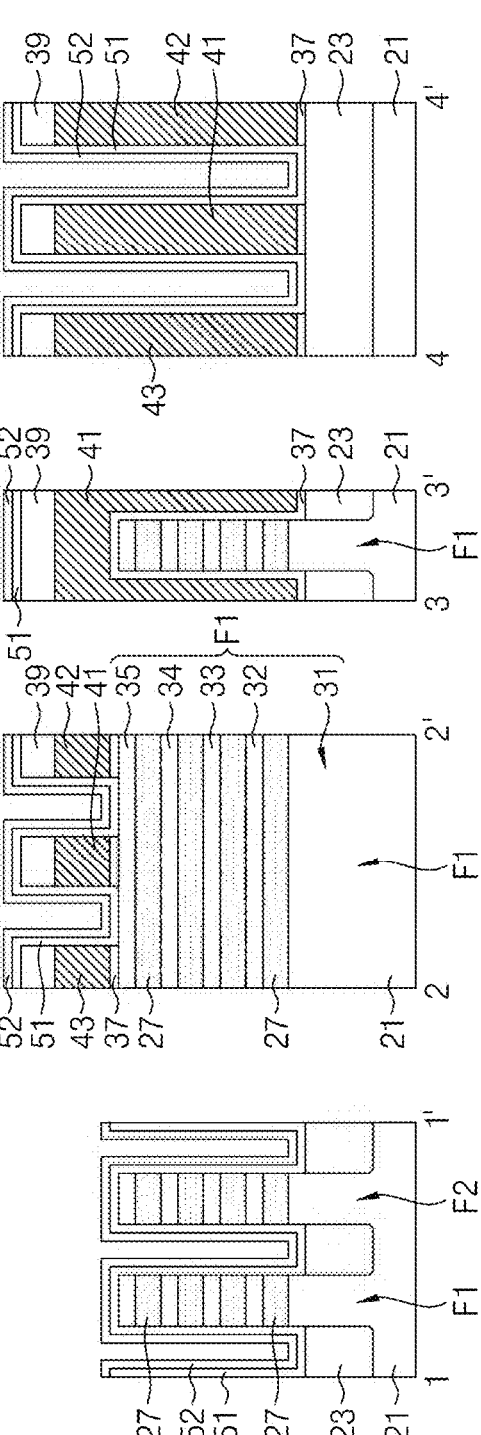

Referring to FIGS. 5 and 14, a second spacer layer 52 may be formed to conformally cover the first spacer layer 51. The second spacer layer 52 may include silicon oxide, silicon nitride, silicon oxynitride, silicon boron nitride (SiBN), silicon carbon nitride (SiCN), silicon oxycarbonitride (SiOCN), low-k dielectrics, high-k dielectrics, or a combination thereof. In some example embodiments, the second spacer layer 52 may include a material having etch selectivity with respect to the first spacer layer 51. The second spacer layer 52 may include a material different from that of the first spacer layer 51. The second spacer layer 52 may include silicon oxide. The second spacer layer 52 may be omitted.

Figure 15:
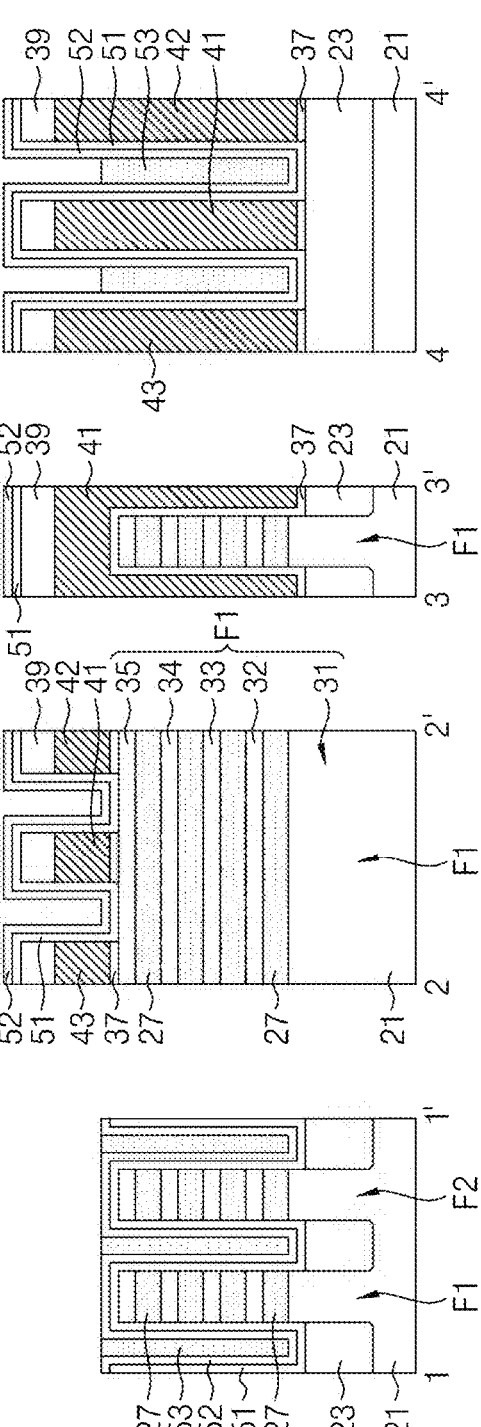

Referring to FIGS. 5 and 15, a sacrificial mold layer 53 may be formed on the second spacer layer 52. The sacrificial mold layer 53 may include a material having etch selectivity with respect to the first spacer layer 51 and the second spacer layer 52. The sacrificial mold layer 53 may include spin-on hardmasks (SOH). Formation of the sacrificial mold layer 53 may include a coating process and an etch-back process. The sacrificial mold layer 53 may be reserved among the plurality of active regions F1 to F6. An upper surface of the second spacer layer 52 may be partially exposed.

Figure 16:
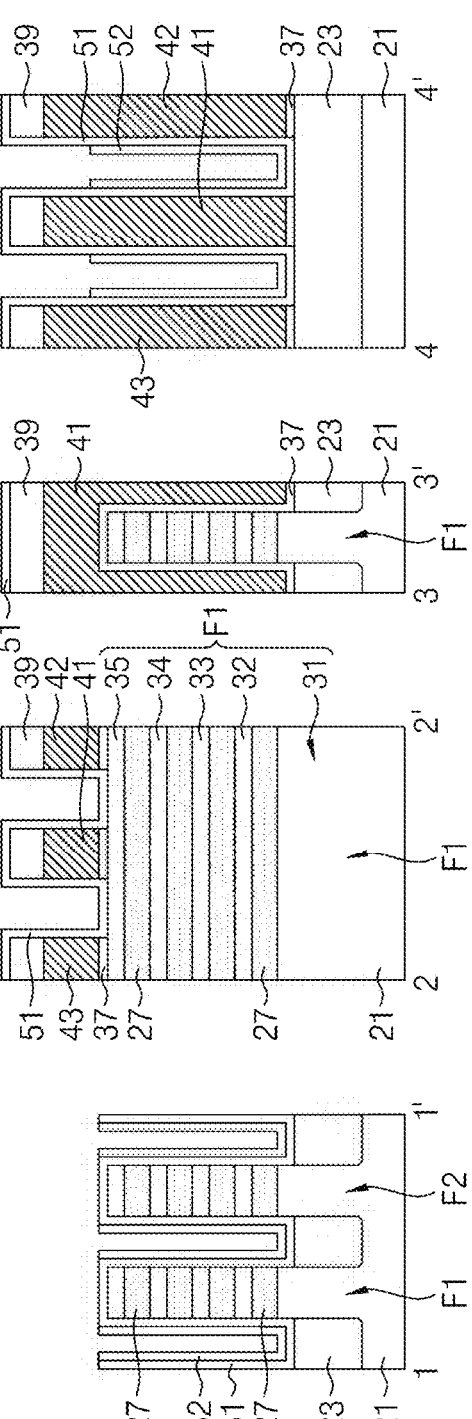

Referring to FIGS. 5 and 16, the first spacer layer 51 may be partially exposed through partial removal of the second spacer layer 52. The second spacer layer 52 may be reserved between the first spacer layer 51 and the sacrificial mold layer 53. The second spacer layer 52 may be exposed through removal of the sacrificial mold layer 53.

Figure 17:
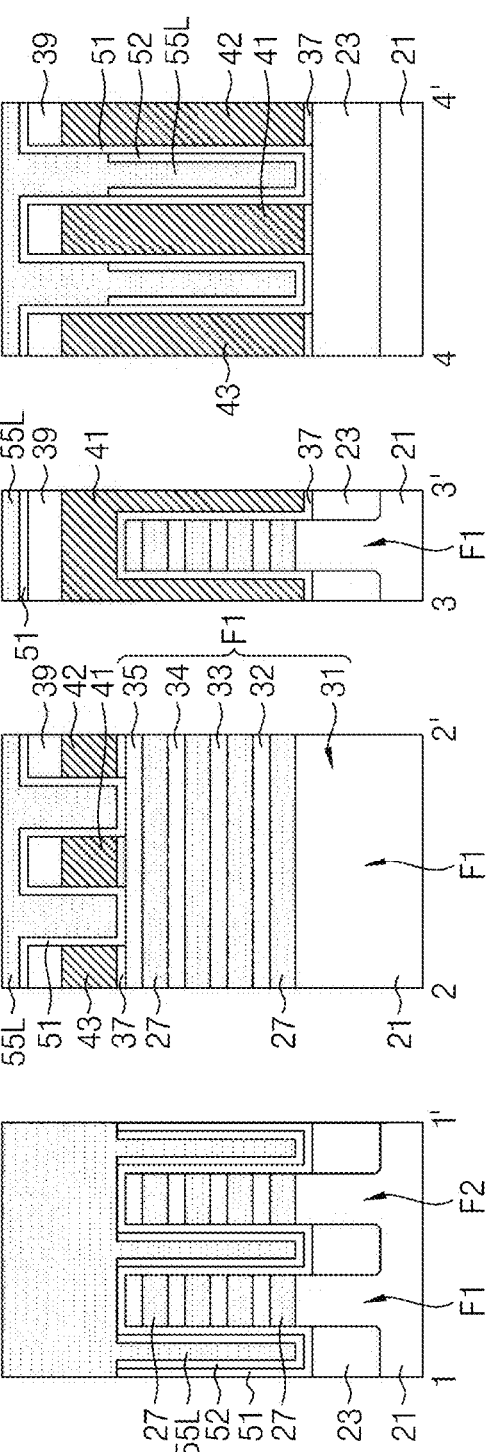

Referring to FIGS. 5 and 17, an insulating layer 55L may be formed to cover the first spacer layer 51 and the second spacer layer 52. The insulating layer 55L may include silicon oxide, silicon nitride, silicon oxynitride, silicon boron nitride (SiBN), silicon carbon nitride (SiCN), silicon oxycarbonitride (SiOCN), metal oxide, low-k dielectrics, high-k dielectrics, or a combination thereof.

In some example embodiments, the insulating layer 55L may include a material having etch selectivity with respect to the first spacer layer 51 and the second spacer layer 52. The insulating layer 55L may include a material different from those of the first spacer layer 51 and the second spacer layer 52. For example, the first spacer layer 51 may include silicon oxycarbonitride (SiOCN), the second spacer layer 52 may include silicon oxide, and the insulating layer 55L may include silicon nitride. The first spacer layer 51 may include silicon nitride, the second spacer layer 52 may include silicon oxide, and the insulating layer 55L may include aluminum oxide such as $Al_2O_3$. The first spacer layer 51 may include silicon nitride, the second spacer layer 52 may include silicon oxide, and the insulating layer 55L may include silicon oxycarbonitride (SiOCN).

Figure 18:
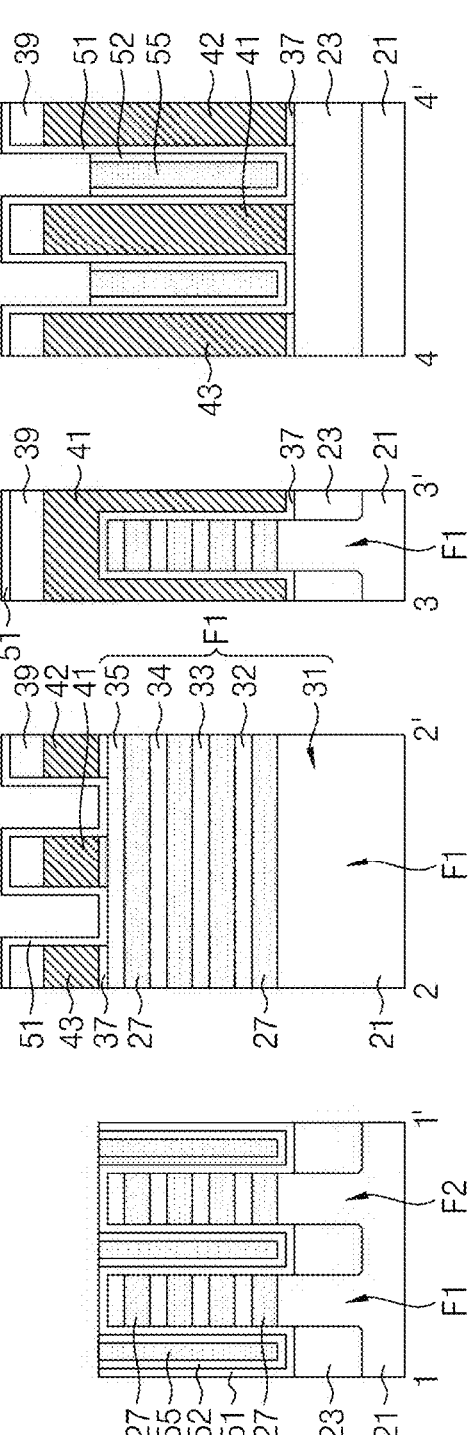

Referring to FIGS. 5 and 18, a plurality of insulating patterns 55 may be formed through partial removal of the insulating layer 55L. Formation of the plurality of insulating patterns 55 through partial removal of the insulating layer 55L may include an etch-back process. The plurality of insulating patterns 55 may be disposed among the plurality of active regions F1 to F6. The second spacer layer 52 may surround lower and side surfaces of the plurality of insulating patterns 55.

Figure 19:
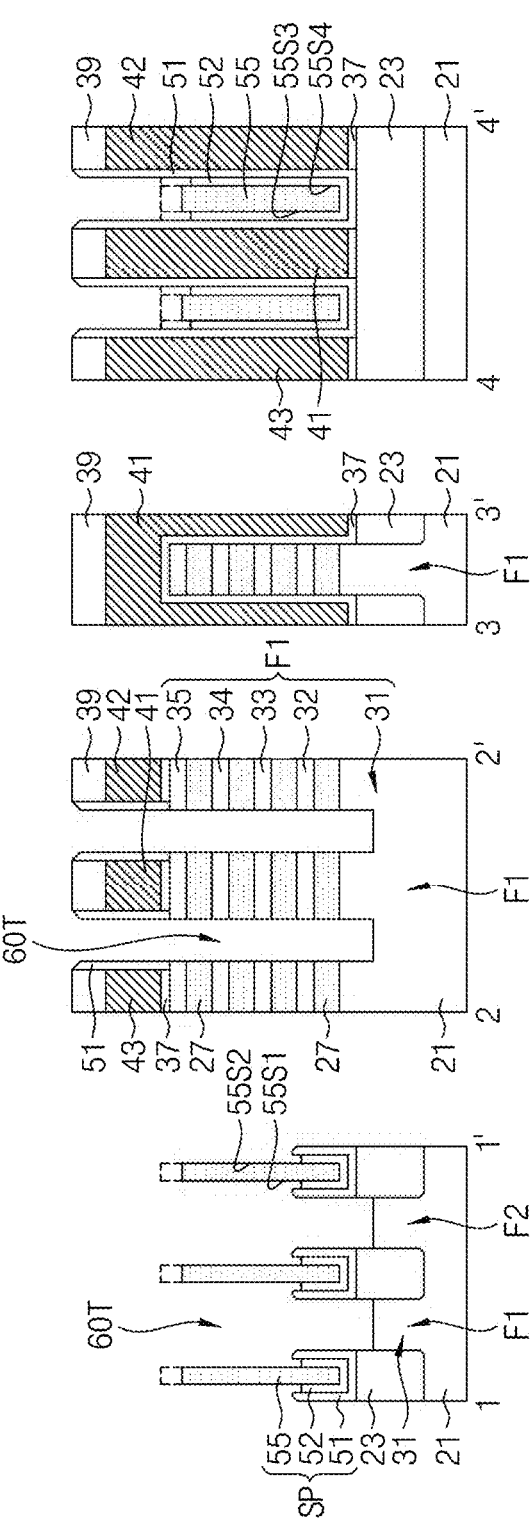

Referring to FIGS. 5 and 19, a plurality of drain trenches 60T may be formed through partial removal of the plurality of active regions F1 to F6. The plurality of drain trenches 60T may be formed among the plurality of temporary gate electrodes 41, 42, and 43. Formation of the plurality of drain trenches 60T through partial removal of the plurality of active regions F1 to F6 may include an anisotropic etching process, a directional etching process, an isotropic etching process, or a combination thereof. Side surfaces of the plurality of active patterns 31 to 35 and the plurality of sacrificial patterns 27 may be exposed at side walls of the plurality of drain trenches 60T. Bottoms of the plurality of drain trenches 60T may be formed at a lower level than an upper end of the first active pattern 31. The first active pattern 31 or the substrate 21 may be exposed at the bottoms of the plurality of drain trenches 60T.

The first spacer layer 51 and the second spacer layer 52 may be partially removed during formation of the plurality of drain trenches 60T through partial removal of the plurality of active regions F1 to F6. The first spacer layer 51 may be reserved on side surfaces of the hard mask pattern 39, the plurality of temporary gate electrodes 41, 42, and 43 and the buffer layer 37. The first spacer layer 51 may be partially reserved on side surfaces of the plurality of insulating patterns 55. The first spacer layer 51 may be reserved between the element isolation layer 23 and the plurality of insulating patterns 55. The first spacer layer 51 may be reserved at a higher level than the bottoms of the plurality of drain trenches 60T.

The second spacer layer 52 may be reserved between the first spacer layer 51 and the plurality of insulating patterns 55. The first spacer layer 51, the second spacer layer 52 and the plurality of insulating patterns 55 may constitute a plurality of separation structures SP.

In some example embodiments, upper surfaces of the first spacer layer 51 and the second spacer layer 52 may be formed at a lower level than upper ends of the plurality of insulating patterns 55. The first spacer layer 51 and the plurality of insulating patterns 55 may be exposed at the side surfaces of the plurality of drain trenches 60T. The first spacer layer 51 may include an inclined upper surface. The inclined upper surface of the first spacer layer 51 may have an inclination descending as the inclined upper surface becomes farther from the plurality of insulating patterns 55. The upper surface of the second spacer layer 52 may be recessed to a lower level than the upper surface of the first spacer layer 51.

In some example embodiments, each of the plurality of insulating patterns 55 may include a first side surface 55S1, a second side surface 55S2, a third side surface 55S3, and a fourth side surface 55S4. The second side surface 55S2 may face the first side surface 55S1. Each of the first side surface 55S1 and the second side surface 55S2 may be adjacent to a corresponding one of the plurality of drain trenches 60T. The fourth side surface 55S4 may face the third side surface 55S3. Each of the third side surface 55S3 and the fourth side surface 55S4 may be adjacent to a corresponding one of the plurality of temporary gate electrodes 41, 42, and 43.

Figure 20:
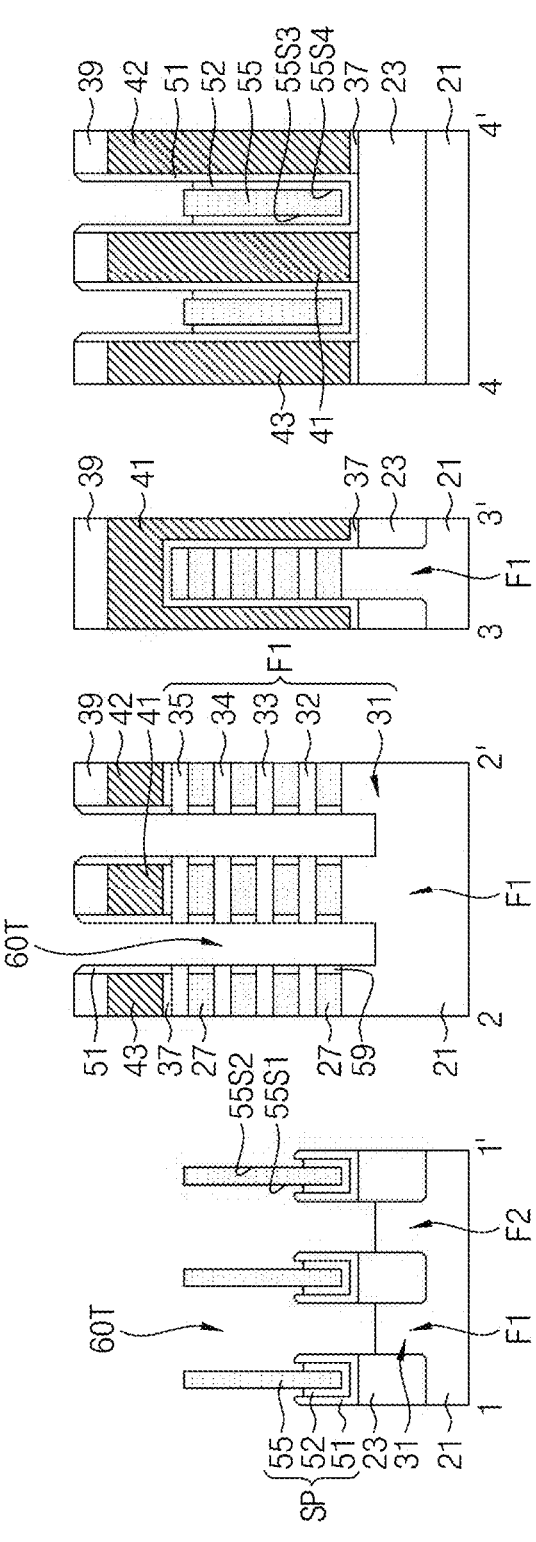

Referring to FIGS. 5 and 20, a plurality of insulating plugs 59 may be formed on side surfaces of the plurality of sacrificial patterns 27. The plurality of insulating plugs 59 may include silicon oxide, silicon nitride, silicon oxynitride, low-k dielectrics, high-k dielectrics, or a combination thereof.

In some example embodiments, formation of the plurality of insulating plugs 59 may include selectively etching the side surfaces of the plurality of sacrificial patterns 27 exposed at the side surfaces of the plurality of drain trenches 60T. Formation of the plurality of insulating plugs 59 may include an insulating thin film formation process and an anisotropic etching process. The plurality of insulating plugs

59 and the plurality of active patterns 31 to 35 may be exposed at the side walls of the plurality of drain trenches 60T.

Figure 21:
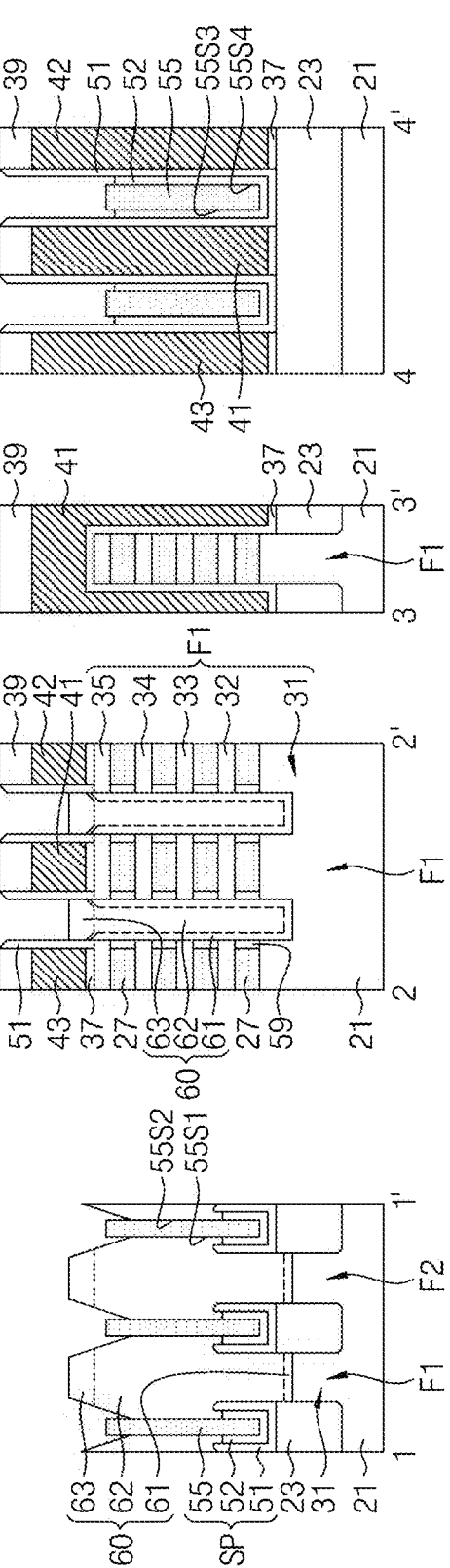

Referring to FIGS. 5 and 21, a plurality of source/drain regions 60 may be formed in the plurality of drain trenches 60T. Formation of the plurality of source/drain regions 60 may include a selective epitaxial growth process. The plurality of source/drain regions 60 may include SiGe, SiC, Si, or a combination thereof.

In some example embodiments, each of the source/drain regions 60 may include a first layer 61, a second layer 62, and a third layer 63. The first layer 61 may cover the plurality of active patterns 31 to 35. The first layer 61 may directly contact the plurality of active patterns 31 to 35. The first layer 61 may include SiGe, Si, or a combination thereof. The second layer 62 may be formed on the first layer 61. The second layer 62 may be thicker than the first layer 61. The second layer 62 may include SiGe. The parts by weight of Ge in the first layer 61 may be smaller than the parts by weight of Ge in the second layer 62. The third layer 63 may be formed on the second layer 62. The third layer 63 may include SiGe, Si, or a combination thereof. The parts by weight of Ge in the third layer 63 may be smaller than the parts by weight of Ge in the second layer 62. In some example embodiments, the third layer 63 may include an Si layer.

In some example embodiments, each of the plurality of source/drain regions 60 may protrude to a higher level than uppermost ends of the plurality of active patterns 31 to 35. The plurality of source/drain regions 60 may contact side surfaces of the plurality of separation structures SP. Each of the plurality of source/drain regions 60 may protrude to a higher level than uppermost ends of the plurality of separation structures SP. The plurality of source/drain regions 60 may be separated from one another by the plurality of separation structures SP.

Figure 22:
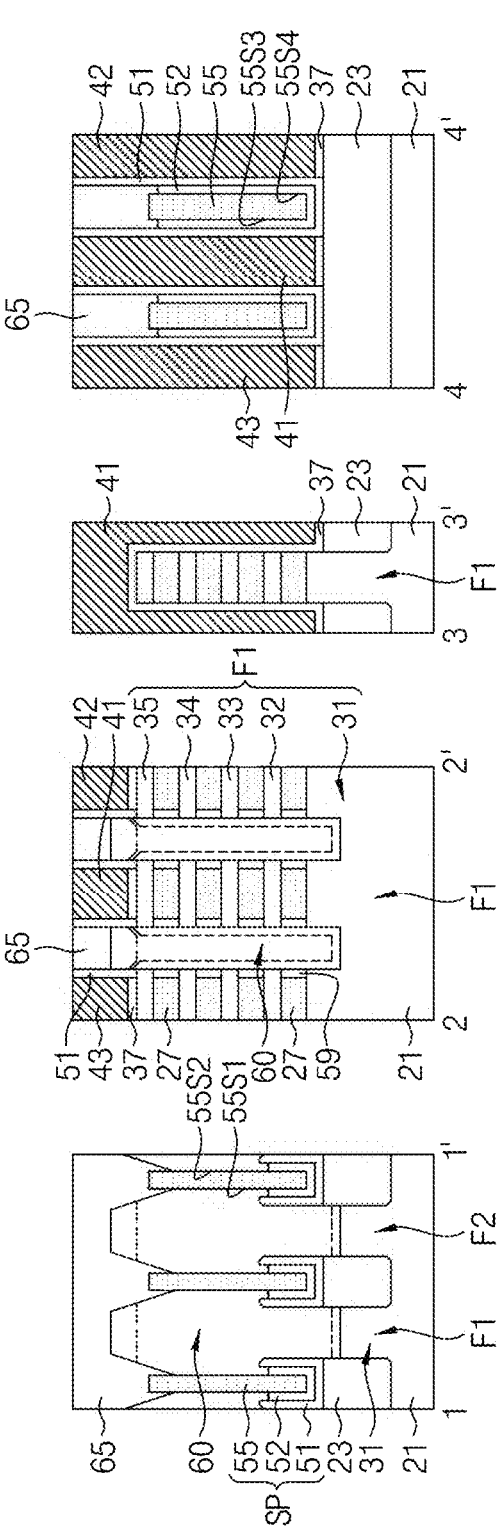

Referring to FIGS. 5 and 22, an interlayer insulating layer 65 may be formed to cover the plurality of source/drain regions 60 and the plurality of separation structures SP. Upper surfaces of the plurality of temporary gate electrodes 41, 42, and 43 may be exposed using a planarization process. The planarization process may include a chemical mechanical polishing (CMP) process. The interlayer insulating layer 65 may include silicon oxide, silicon nitride, silicon oxynitride, low-k dielectrics, high-k dielectrics, or a combination thereof. An upper surface of the interlayer insulating layer 65 and the upper surfaces of the first spacer layer 51 and the plurality of temporary gate electrodes 41, 42, and 43 may be exposed on substantially the same plane. The interlayer insulating layer 65 may cover the plurality of insulating patterns 55. The interlayer insulating layer 65 may directly contact the plurality of insulating patterns 55.

Figure 23:
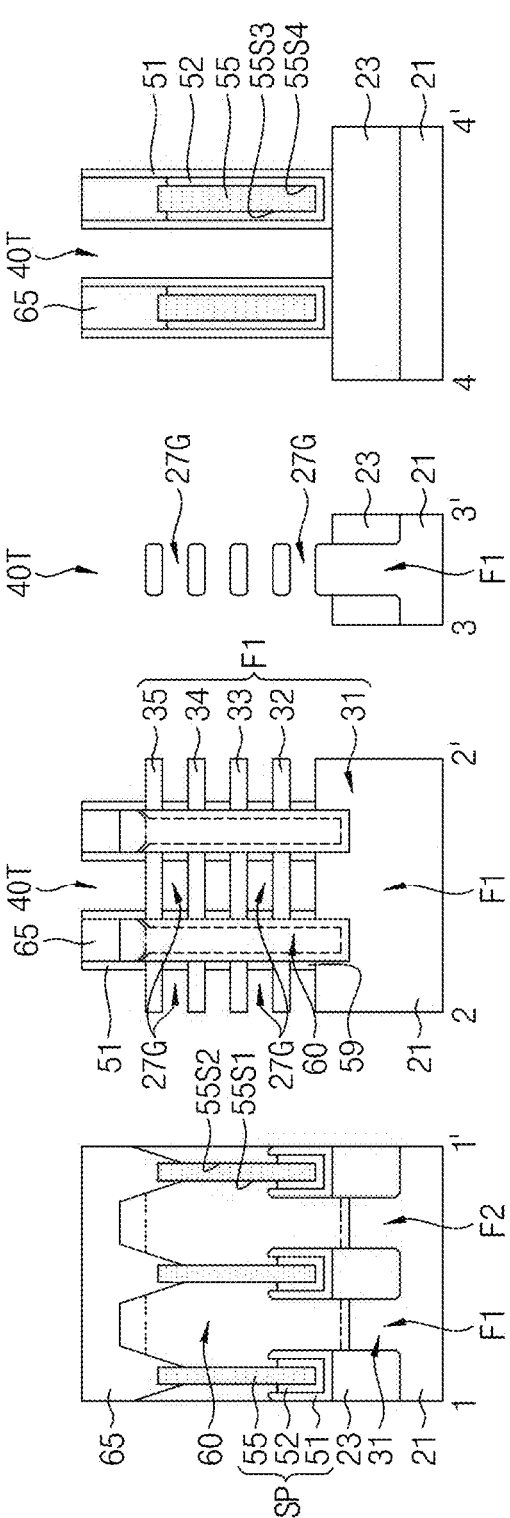

Referring to FIGS. 5 and 23, a plurality of gate trenches 40T and a plurality of gap regions 27G may be formed through removal of the plurality of temporary gate electrodes 41, 42, and 43, the buffer layer 37 and the plurality of sacrificial patterns 27. The plurality of gap regions 27G may be formed among the plurality of active regions F1 to F6. The plurality of gap regions 27G may communicate with the plurality of gate trenches 40T.

Figure 24:
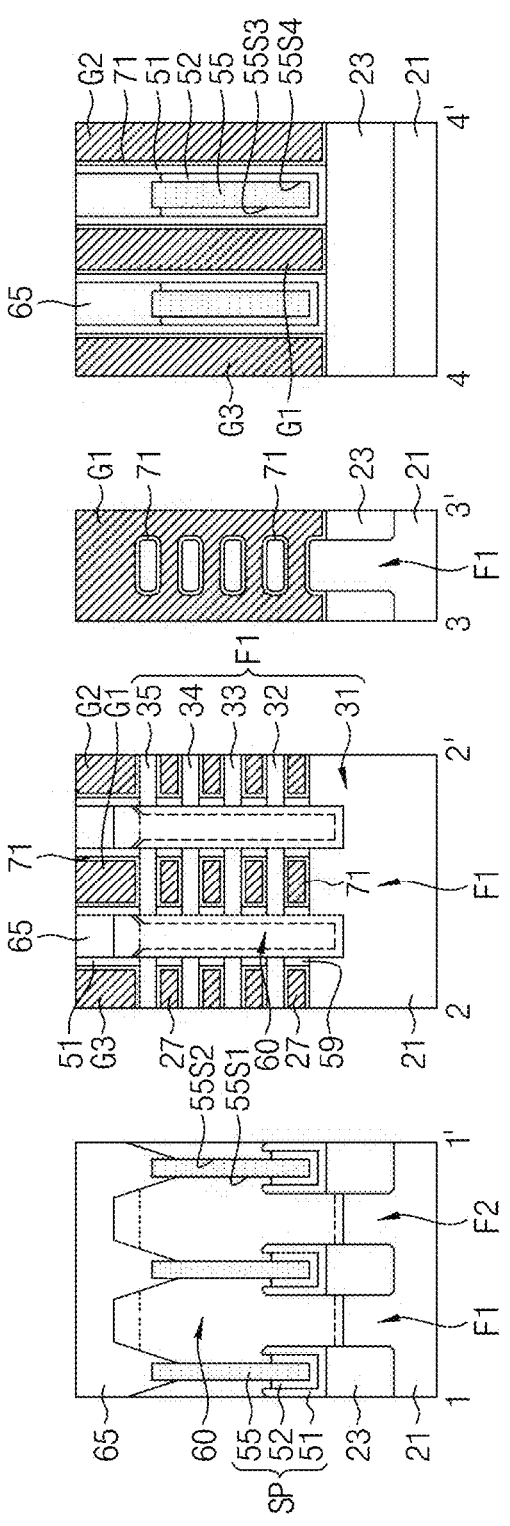

Referring to FIGS. 5 and 24, a gate dielectric layer 71 and a plurality of gate electrodes G1 to G3 may be formed in the plurality of gap regions 27G and the plurality of gate trenches 40T. The gate dielectric layer 71 may include silicon oxide, silicon nitride, silicon oxynitride, high-k dielectrics, or a combination thereof. The gate dielectric layer 71 may include a single layer or multiple layers. In some example embodiments, the gate dielectric layer 71 may include a silicon oxide layer, an LaO layer on the silicon oxide layer, and a high-k dielectric layer, such as an HfO layer, on the LaO layer.

The plurality of gate electrodes G1 to G3 may include metal, metal nitride, metal oxide, metal silicide, conductive carbon, polysilicon, or a combination thereof. The plurality of gate electrodes G1 to G3 may include a single layer or multiple layers. In some example embodiments, each of the plurality of gate electrodes G1 to G3 may include a work-function metal layer or a gate conductive layer. The work-function metal layer may include Ti, TiN, Ta, TaN, or a combination thereof. The gate conductive layer may include W, WN, Ti, TiN, Ta, TaN, Ru, or a combination thereof. Each of the plurality of gate electrodes G1 to G3 may correspond to a replacement metal gate electrode.

Figure 25:
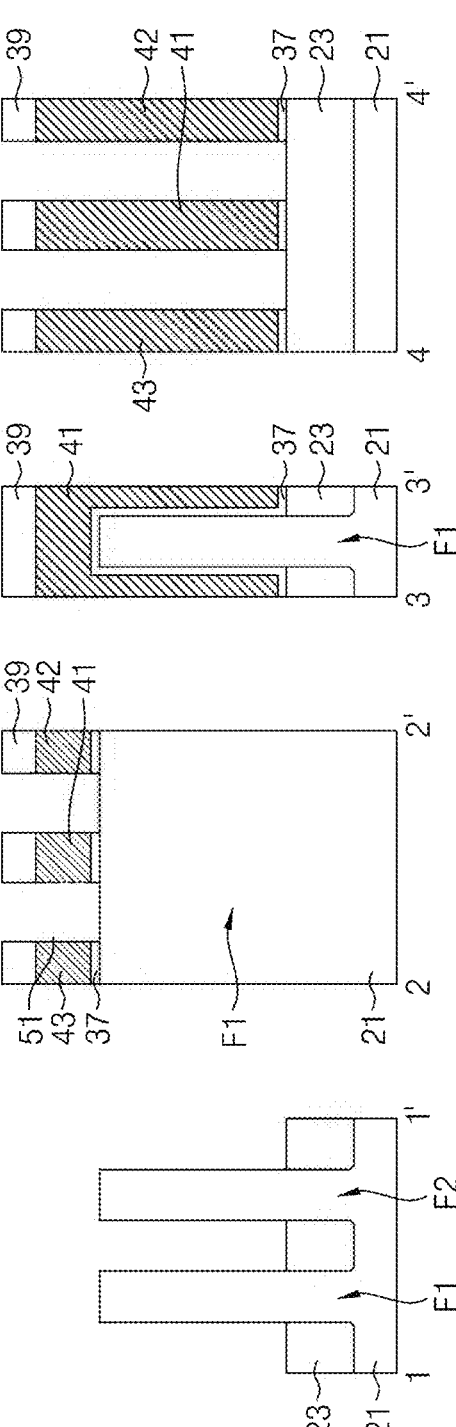
Figure 26:
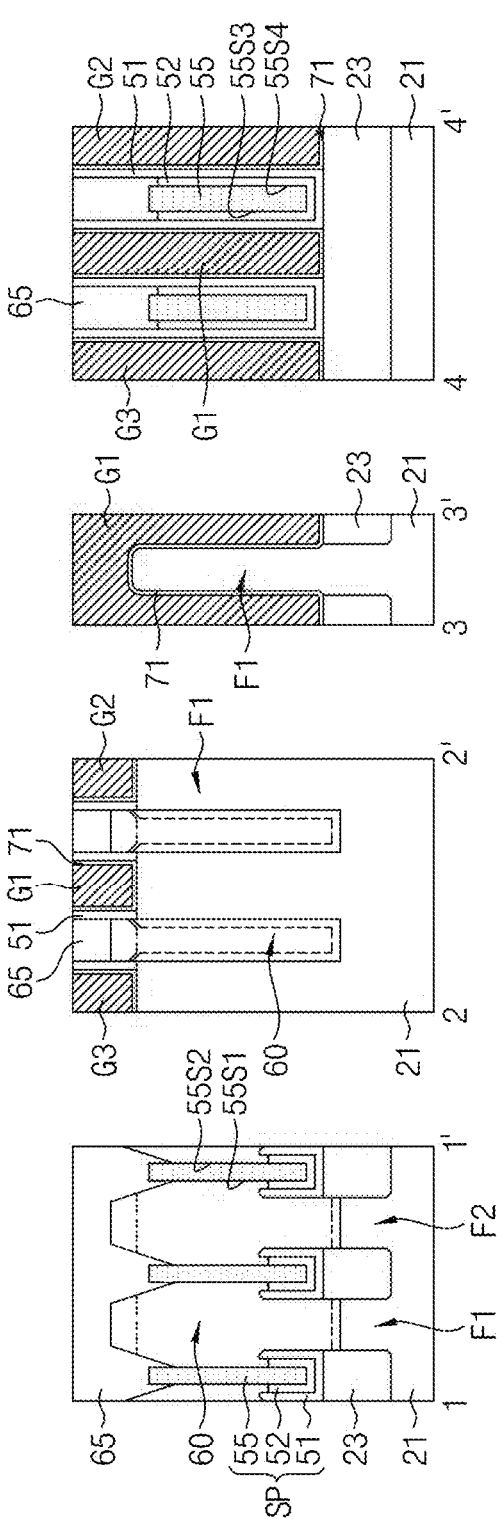

FIGS. 25 and 26 may be cross-sectional views taken along lines 1-1', 2-2', 3-3' and 4-4' in FIG. 5, to explain formation methods of semiconductor devices according to some example embodiments of the inventive concepts.

Referring to FIGS. 5 and 25, each of a plurality of active regions F1 to F6 may have a vertical height greater than a horizontal width thereof. Each of the plurality of active regions F1 to F6 may include a fin shape. An upper surface of an element isolation layer 23 may be recessed to a lower level than upper ends of the plurality of active regions F1 to F6. Each of a plurality of temporary gate electrodes 41, 42, and 43 may extend on the element isolation layer 23 while covering upper and side surfaces of a corresponding one of the plurality of active regions F1 to F6. A buffer layer 37 may be formed between the plurality of temporary gate electrodes 41, 42, and 43 and the plurality of active regions F1 to F6 and between the plurality of temporary gate electrodes 41, 42, and 43 and the element isolation layer 23.

Referring to FIGS. 5 and 26, each of a plurality of gate electrodes G1 to G3 may extend on the element isolation layer 23 while covering the upper and side surfaces of a corresponding one of the plurality of active regions F1 to F6. A gate dielectric layer 71 may be formed between the plurality of gate electrodes G1 to G3 and the plurality of active regions F1 to F6 and between the plurality of gate electrodes G1 to G3 and the element isolation layer 23.

Figure 27:
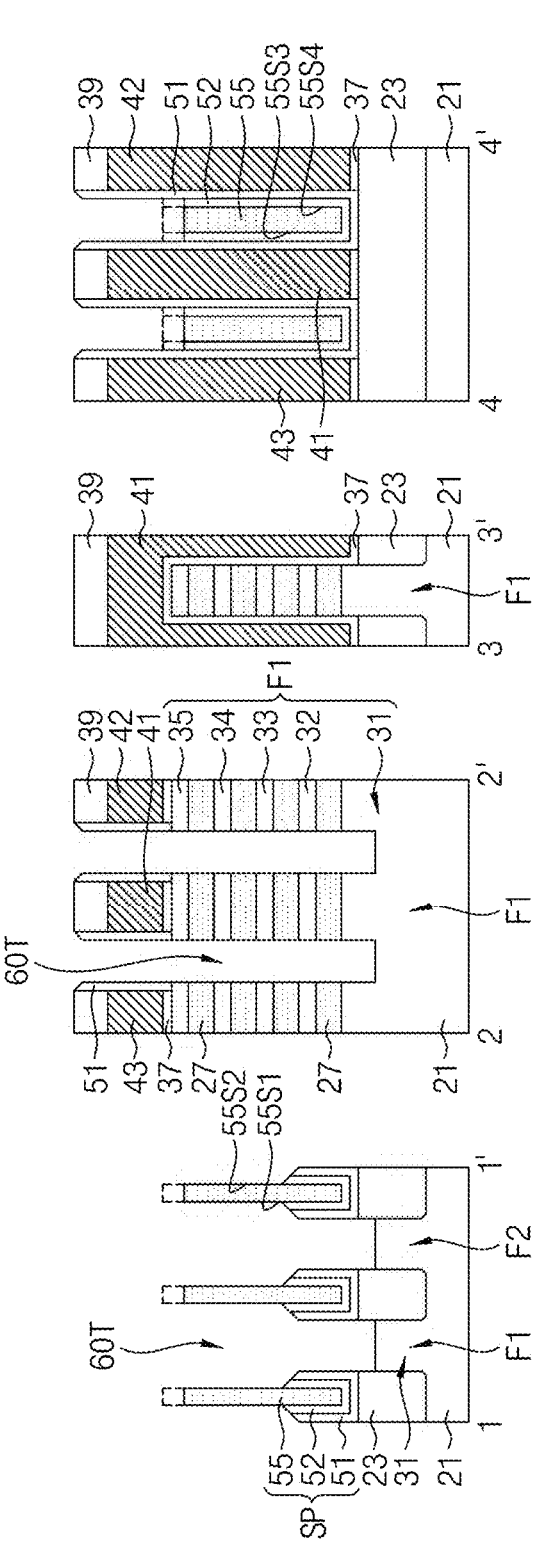
Figure 28:
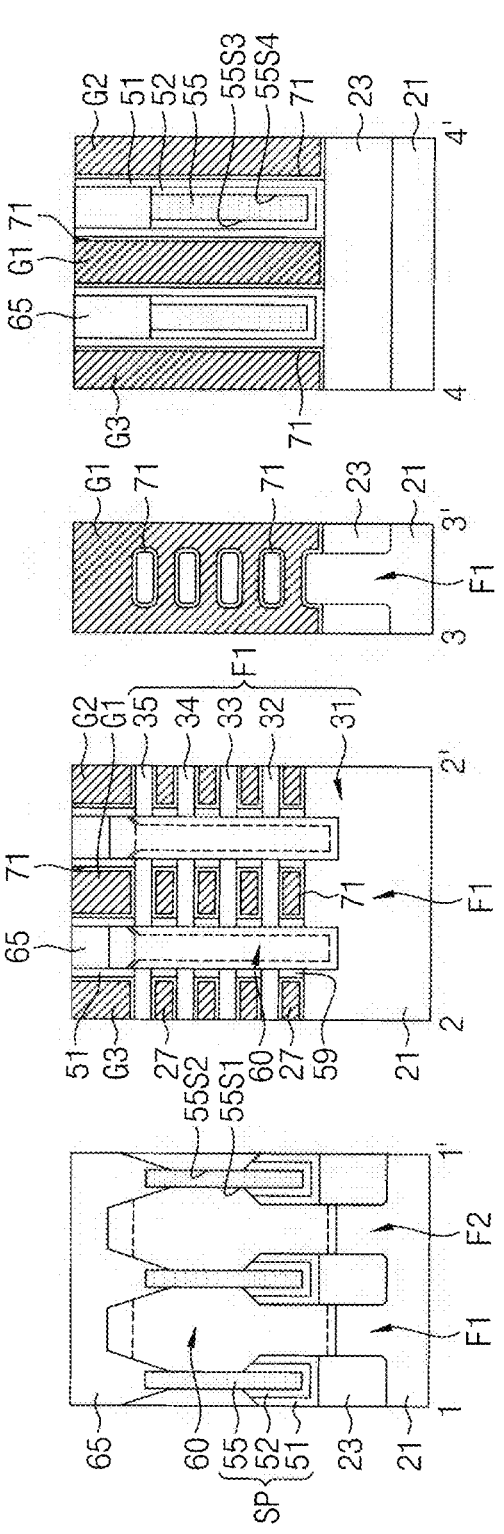

FIGS. 27 and 28 may be cross-sectional views taken along lines 1-1', 2-2', 3-3' and 4-4' in FIG. 5, to explain formation methods of semiconductor devices according to some example embodiments of the inventive concepts.

Referring to FIGS. 5 and 27, an upper surface of a second spacer layer 52 adjacent to first and second side surfaces 55S1 and 55S2 may be farther from a lower surface 21s of the substrate 21 than an upper surface of a first spacer layer 51 adjacent to the first and second side surfaces 55S1 and 55S2. The first spacer layer 51 and the second spacer layer 52 adjacent to the first and second side surfaces 55S1 and 55S2 may include inclined upper surfaces, respectively. The inclined upper surfaces may have an inclination descending as the inclined upper surfaces become farther from an insulating pattern 55. An upper surface of the second spacer layer 52 adjacent to third and fourth side surfaces 55S3 and 55S4 may be substantially coplanar with an upper surface of the insulating pattern 55.

Referring to FIGS. 5 and 28, the upper surface of the second spacer layer 52 adjacent to the first and second side surfaces 55S1 and 55S2 may protrude to a higher level than the upper surface of the first spacer layer 51 adjacent to the first and second side surfaces 55S1 and 55S2.

Figure 29:
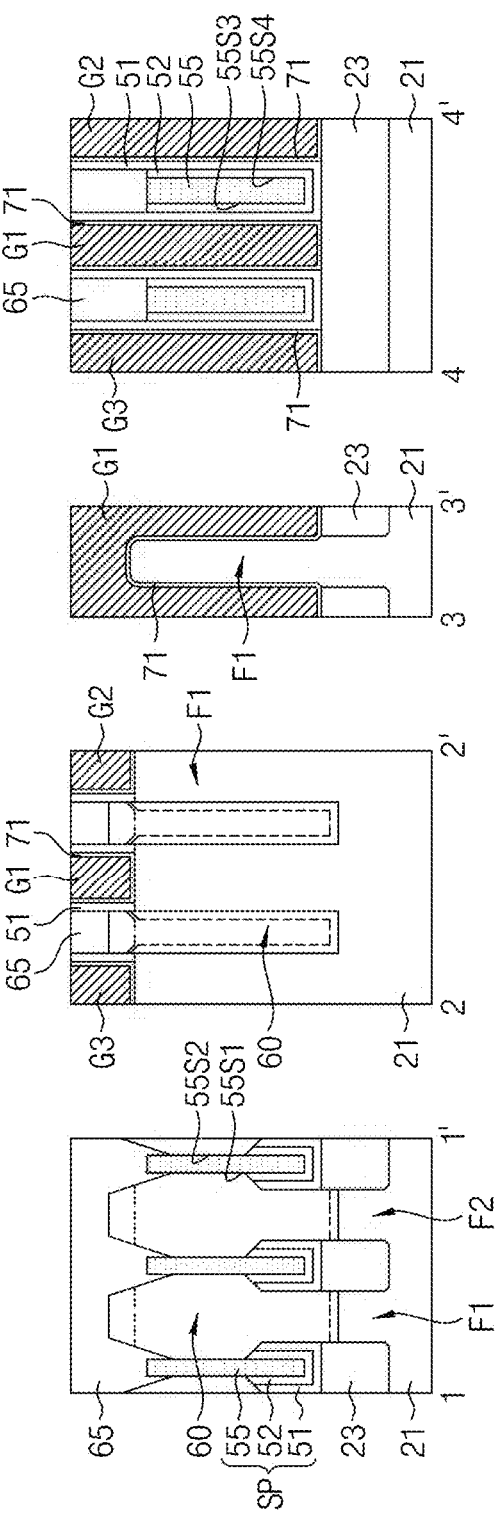

FIG. 29 may be a cross-sectional view taken along lines 1-1', 2-2', 3-3' and 4-4' in FIG. 5, to explain formation methods of semiconductor devices according to some example embodiments of the inventive concepts.

Referring to FIGS. 5 and 29, each of a plurality of active regions F1 to F6 may have a vertical height greater than a horizontal width thereof. An upper surface of an element isolation layer 23 may be recessed to a lower level than upper ends of the plurality of active regions F1 to F6. Each of the plurality of gate electrodes G1 to G3 may extend on the element isolation layer 23 while covering upper and side surfaces of a corresponding one of the plurality of active regions F1 to F6. An upper surface of a second spacer layer 52 adjacent to first and second side surfaces 55S1 and 55S2 may protrude to a higher level than an upper surface of a first spacer layer 51 adjacent to the first and second side surfaces 55S1 and 55S2.

Figure 30:
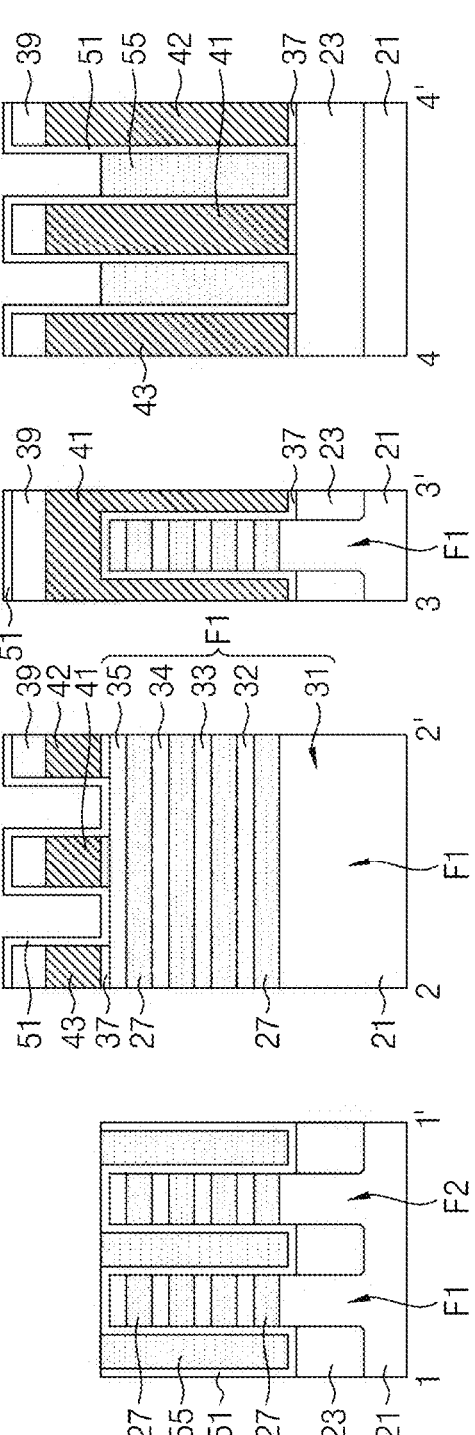
Figure 31:
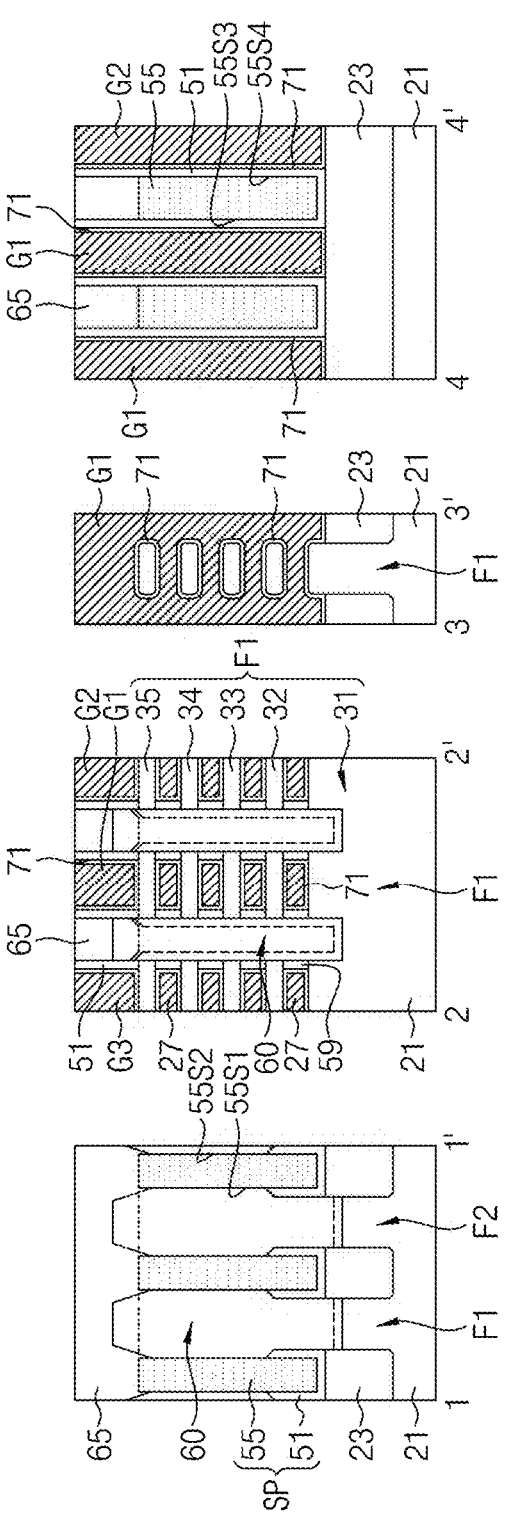

FIGS. 30 and 31 may be cross-sectional views taken along lines 1-1', 2-2', 3-3' and 4-4' in FIG. 5, to explain formation methods of semiconductor devices according to some example embodiments of the inventive concepts.

Referring to FIGS. 5 and 30, a plurality of insulating patterns 55 may be formed on a first spacer layer 51. The plurality of insulating patterns 55 may be disposed among a plurality of active regions F1 to F6. The first spacer layer 51 may surround side and lower surfaces of the plurality of insulating patterns 55. The first spacer layer 51 may extend between the element isolation layer 23 and the plurality of insulating patterns 55.

Referring to FIGS. 5 and 31, each of a plurality of separation structures SP may include the first spacer layer 51 and the insulating pattern 55. The first spacer layer 51 may partially cover lower and side surfaces of the insulating pattern 55. The first spacer layer 51, which is adjacent to first and second side surfaces 55S1 and 55S2, may include an inclined upper surface. The inclined upper surface may have an inclination descending as the inclined upper surface becomes farther from the insulating pattern 55.

Figure 32:
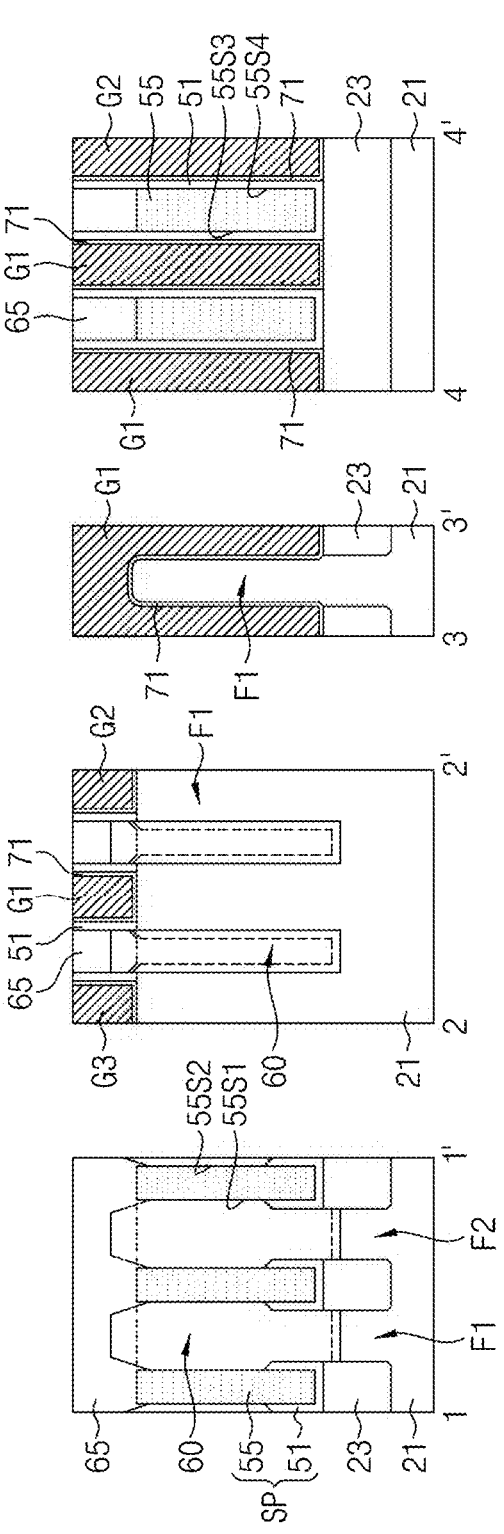

FIG. 32 may be a cross-sectional view taken along lines 1-1', 2-2', 3-3' and 4-4' in FIG. 5, to explain formation methods of semiconductor devices according to some example embodiments of the inventive concepts.

Referring to FIGS. 5 and 32, each of a plurality of active regions F1 to F6 may have a vertical height greater than a horizontal width thereof. An upper surface of an element isolation layer 23 may be recessed to a lower level than upper ends of the plurality of active regions F1 to F6. Each of a plurality of gate electrodes G1 to G3 may extend on the element isolation layer 23 while covering upper and side surfaces of a corresponding one of the plurality of active regions F1 to F6. Each of a plurality of separation structures SP may include the first spacer layer 51 and the insulating pattern 55.

In accordance with the some example embodiments of the inventive concepts, a separation structure may be provided among a plurality of source/drain regions. The separation structure may include an insulating pattern and a spacer layer. An uppermost end of the insulating pattern protrudes to a higher level than an upper surface of the spacer layer. It may be possible to realize semiconductor devices having excellent electrical characteristics while being advantageous in terms of mass production efficiency.

While the embodiments of the inventive concepts have been described with reference to the accompanying drawings, it should be understood by those skilled in the art that various modifications may be made without departing from the scope of the inventive concepts and without changing essential features thereof. Therefore, the above-described embodiments should be considered in a descriptive sense only and not for purposes of limitation.

What is claimed is:

1. A semiconductor device, comprising:
a plurality of active regions on a substrate;
a gate electrode intersecting the plurality of active regions;
a plurality of source/drain regions on the plurality of active regions, such that the plurality of source/drain regions are adjacent to opposite sides of the gate electrode and the gate electrode is between the plurality of source/drain regions; and
a plurality of separation structures, each separate separation structure of the plurality of separation structures between proximate source/drain regions of the plurality of source/drain regions,
wherein each separation structure of the plurality of separation structures includes
an insulating pattern that includes a first side surface and a second side surface that are opposite side surfaces of the insulating pattern and are adjacent to separate, respective source/drain regions of the proximate source/drain regions, and
a spacer layer on the first side surface and the second side surface, and the spacer layer at least partially between the insulating pattern and the separate, respective source/drain regions,
wherein an uppermost end of the insulating pattern is farther from a lower surface of the substrate than a first upper surface of the spacer layer that is proximate to the first side surface and the second side surface,
wherein the first side surface and the second side surface of the insulating pattern each include
a lower portion contacting the spacer layer,
a middle portion contacting the respective source/drain regions of the proximate source/drain regions, and
an upper portion spaced apart from the respective source/drain regions of the proximate source/drain regions,
wherein a lower surface of the spacer layer is further from the lower surface of the substrate than a central portion of a lower surface of the respective source/drain regions of the proximate source/drain regions,
wherein the spacer layer includes
a first spacer layer, and
a second spacer layer between the first spacer layer and the insulating pattern,
wherein each of an upper surface of the first spacer layer and an upper surface of the second spacer layer that is proximate to the first side surface of the insulating pattern and the second side surface of the insulating pattern vertically overlaps and entirely contacts an outer portion of the respective source/drain regions of the proximate source/drain regions, and
wherein the upper surface of the second spacer layer is closer to the lower surface of the substrate than the upper surface of the first spacer layer.

2. The semiconductor device according to claim 1, wherein the uppermost end of the insulating pattern is at a higher level than a center of each of the plurality of source/drain regions.

3. The semiconductor device according to claim 1, wherein
each of the plurality of source/drain regions may have a varying width, and
the uppermost end of the insulating pattern is at a higher level than a portion having a maximum horizontal width from among portions of each of the plurality of source/drain regions.

4. The semiconductor device according to claim 1, wherein a portion of each of the plurality of source/drain regions directly contact the first side surface and the second side surface.

5. The semiconductor device according to claim 1, wherein a distance between the first upper surface of the spacer layer and the uppermost end of the insulating pattern is about 10 nm to about 50 nm.

6. The semiconductor device according to claim 1, wherein: the upper surface of the first spacer layer includes an inclined upper surface; and the inclined upper surface has an inclination descending as the inclined upper surface becomes farther from the insulating pattern.

7. The semiconductor device according to claim 1, wherein:
the insulating pattern comprises silicon nitride; and
the spacer layer comprises silicon oxycarbonitride (SiOCN).

8. The semiconductor device according to claim 1, wherein the spacer layer surrounds a lower surface of the insulating pattern.

9. The semiconductor device according to claim 1, wherein:
the second spacer layer comprises a material different from a material of the first spacer layer.

10. The semiconductor device according to claim 1, wherein:
the first spacer layer comprises silicon oxycarbonitride (SiOCN);
the second spacer layer comprises silicon oxide; and
the insulating pattern comprises silicon nitride.

11. The semiconductor device according to claim 1, wherein
the insulating pattern further comprises a third side surface facing the gate electrode; and
the spacer layer extends between the insulating pattern and the gate electrode.

12. The semiconductor device according to claim 11, wherein the uppermost end of the insulating pattern is nearer to the lower surface of the substrate than a second upper surface of the spacer layer that is adjacent to the third side surface.

13. The semiconductor device according to claim 1, wherein:
each of the plurality of active regions comprises a plurality of active patterns contacting the plurality of source/drain regions; and
the gate electrode covers upper and side surfaces of the plurality of active patterns.

14. The semiconductor device according to claim 13, wherein the gate electrode surrounds upper, lower and side surfaces of at least one of the plurality of active patterns.

* * * * *